US00RE38880E

(19) United States
(12) Reissued Patent
Behnke et al.

(10) Patent Number: US RE38,880 E
(45) Date of Reissued Patent: Nov. 22, 2005

(54) INSPECTION HANDLER APPARATUS AND METHOD

(75) Inventors: Merlin E. Behnke, Grafton, WI (US); Michael L. Schneider, Wauwatosa, WI (US); Donald P. McGee, Oconomowoc, WI (US); Robert G. Bertz, Wauwatosa, WI (US); William Fusco, Jr., Pewaukee, WI (US); Todd K. Pichler, Muskego, WI (US); Jon P. Ubert, New Berlin, WI (US); Steven J. Bilodeau, Setauket, NY (US); Frank L. Jacovino, Plainview, NY (US)

(73) Assignee: Robotic Vision Systems, Inc., Canton, MA (US)

(21) Appl. No.: 10/122,372

(22) PCT Filed: Jul. 15, 1998

(86) PCT No.: PCT/US98/14441

§ 371 (c)(1),
(2), (4) Date: Sep. 27, 1999

(87) PCT Pub. No.: WO99/03603

PCT Pub. Date: Jan. 28, 1999

Related U.S. Patent Documents

Reissue of:
(64) Patent No.: 6,293,408
Issued: Sep. 25, 2001
Appl. No.: 09/142,338
Filed: Sep. 27, 1999

U.S. Applications:
(60) Provisional application No. 60/052,698, filed on Jul. 16, 1997, and provisional application No. 60/073,885, filed on Feb. 6, 1998.

(51) Int. Cl.[7] ..... B07C 5/02
(52) U.S. Cl. ..... 209/540; 209/541; 209/556; 414/788.6; 414/788.7
(58) Field of Search ..... 209/540, 542, 209/556, 900, 922, 541; 414/788.4, 788.5, 788.6, 788.7; 198/339.1

(56) References Cited

U.S. PATENT DOCUMENTS

| | | | |
|---|---|---|---|
| 3,888,674 | A | 6/1975 | Nygaard |
| 4,508,452 | A | 4/1985 | DiMatteo et al. |
| 4,746,154 | A | 5/1988 | James et al. |

(Continued)

FOREIGN PATENT DOCUMENTS

| | | |
|---|---|---|
| GB | 2 2499 868 A | 5/1992 |
| JP | 4 234 143 | 8/1992 |
| JP | 8 335 621 | 12/1996 |

*Primary Examiner*—Donald P. Walsh
*Assistant Examiner*—Kaitlin Joerger
(74) *Attorney, Agent, or Firm*—Michael Best & Friedrich, LLP

(57) ABSTRACT

An apparatus for processing electronic circuit devices includes an infeed station, a first inspection station, an inverter station, a second inspection station, a sorting station, and an outfeed station. A linear transport mechanism having side edges transports a first work piece containing a plurality of electronic circuit devices through the stations along a linear path. The inverter station holds an empty second work piece above the transport mechanism in an inverted orientation. The inverter station also includes an elevator for lifting the first work piece vertically into an abutting relationship with the second work piece, and an inverting mechanism for inverting the first and second work pieces while maintaining them in the abutting relationship to position the electronic devices in the second work piece in the inverted orientation. The inverter station executes the work piece inverting action while maintaining the work pieces above the linear transport mechanism and between the side edges of the linear transport mechanism. Thus, the electronic circuit devices are inspected at the first inspection station in a first orientation in the first work piece, and are inspected at the second inspection station in an inverted orientation in the second work piece.

31 Claims, 16 Drawing Sheets

U.S. PATENT DOCUMENTS

| | | | |
|---|---|---|---|
| 4,999,785 | A | 3/1991 | Schmuter |
| 5,049,030 | A | 9/1991 | Lockert |
| 5,168,218 | A | 12/1992 | Rich |
| 5,207,331 | A | 5/1993 | Teegarden et al. |
| 5,371,375 | A | 12/1994 | Stern et al. |
| 5,441,380 | A | 8/1995 | Horikawa |
| 5,463,277 | A | 10/1995 | Kimura et al. |
| 5,465,152 | A | 11/1995 | Bilodeau et al. |
| 5,588,797 | A | 12/1996 | Smith |
| 5,600,150 | A | 2/1997 | Stern et al. |
| 6,139,243 | A | 10/2000 | Jackson et al. |

301
302
303
307
319
320
321
323
324
325
326
327
328
330
331
335
336
337
338
339
340
341
342
344
345
347
348
349
351
352
353
354
355
356
357
358
360
370
371
372
373
396
511

14
54
56
64
66a
76
78
90b
82
88
72
106
70a
19
19
120
74
116
92
94
84
102
108
124
100
80
86
90a
46
150

INSPECTION HANDLER APPARATUS AND METHOD

Matter enclosed in heavy brackets [ ] appears in the original patent but forms no part of this reissue specification; matter printed in italics indicates the additions made by reissue.

RELATED APPLICATIONS

This application claims the benefit of 35 U.S.C. §119 of co-pending provisional patent applications No. 60/052,698, filed Jul. 16, 1997 and Ser. No. 60/073,885, filed Feb. 6, 1998.

FIELD OF THE INVENTION

This invention relates to an apparatus and method for inspecting and handling devices that are semi-constrained in compartmented trays. More particularly, the invention relates to an apparatus and method for conveying devices contained in trays to and through multiple inspection and handling stations.

BACKGROUND OF THE INVENTION

Semiconductor devices such as integrated circuit chips need to be precisely fabricated since exact precision is required to insure that such devices have an exact predetermined geometry. Although such fabrication produces high quality results, defective devices are fabricated that have geometry variations in coplanarity, span and sweep as well as mark defects in content, legibility, contrast, orientation and quality, which are outside tolerances for acceptable devices. Accordingly, inspection of the devices is necessary to ascertain whether the devices meet exacting acceptance standards. The inspection stages generally include both camera and laser inspections.

The semiconductor devices to be inspected are typically provided in compartmented trays which have multiple rows and columns of pockets into which the devices are placed. Trays typically hold between 50 and 100 devices, and the trays are often configured to be stackable.

Machines of the type to which this invention relates have been used in the past. In that regard it has been proposed to cycle a tray loaded with semiconductors from an input module through intervening inspection modules and a pick-and-place module to an outfeed module, and to achieve an inversion of the semiconductors between the inspection modules. A desire in connection with such machines is ongoing to increase the speed and reliability of processing the semiconductors and to do so without complicating the structure or system.

Accordingly, among the objects of this invention are to improve the speed and reliability of the inspection and/or otherwise processing of such semiconductors and to do so without complicating either the machine's structure or the process.

SUMMARY OF THE INVENTION

For the achievement of these and other objects, this invention proposes to transport trays loaded with semiconductor devices through the infeed, inspection, pick-and-place (PNP) and outfeed modules, and an inverter module, along a linear path. That is, the transport moves the loaded tray in a straight line to and through the modules with the various operations being performed on the tray and the semiconductor devices carried in the tray, with the tray positioned on or in registry with that linear path. Consistent with that format, the inversion of the tray between inspection modules is accomplished by displacing the devices while in a tray vertically from the linear path, rotating the devices 180 degrees while they are still held captive in the tray, and returning the devices to the liner path, again in a tray. In executing the inversion, the inverter module is loaded with a pre-positioned empty, transfer tray which cooperates with an incoming loaded carrier tray to achieve the inversion. In the course of carrying out the inversion step, the pre-positioned tray becomes a carrier tray and exits the inverter module as a carrier tray loaded with the semiconductor devices. What had been the carrier tray remains in the inverter module and awaits arrival of a subsequent, incoming carrier tray. The tray left in the inverter module is itself rotated 180 degrees to be in the proper orientation for cooperation with the next incoming carrier tray and becomes a pre-positioned tray.

Other features and advantages of the invention will become apparent to those of ordinary skill in the art upon review of the following detailed description and drawings.

BRIEF DESCRIPTION OF THE DRAWINGS

FIG. 17 is a plan view of an alternative tray inverter holder assembly embodying the invention;

FIG. 19 is a sectional view taken along line 19—19 of FIG. 18;

Figure 1:
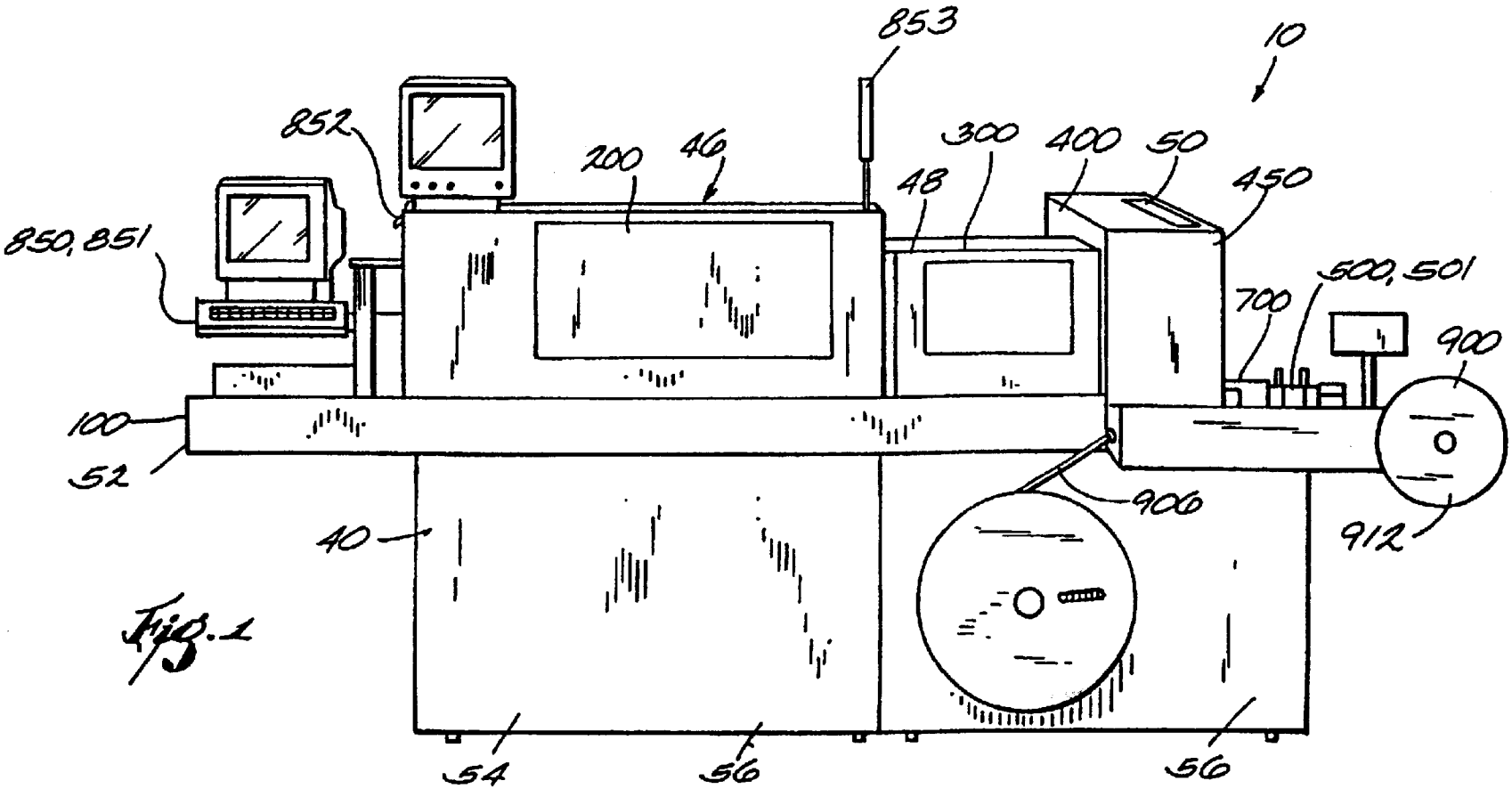
FIG. 1 is a front view of an inspection handler apparatus.

Before one embodiment of the invention is explained in detail, it is to be understood that the invention is not limited in its application to the details of construction and the arrangement of components or steps set forth in the following description or illustrated in the drawings. The invention is capable of other embodiments and of being practiced or being carried out in various other ways. Also, it is to be understood that the phraseology and terminology used herein is for the purpose of description and should not be regarded as limiting.

DETAILED DESCRIPTION OF THE PREFERRED EMBODIMENT

As previously mentioned, the infeed module, scanner module, package vision inspection (PVI)module, PNP module and outfeed modules can be of well-known construction and operation. For that reason, those modules have been illustrated schematically and will not be described in detail. The inverter module will be described in detail, and parts of the overall tray transport arrangement will be as well so as to define the linear path along which the trays are moved.

Addressing first the modules other than the inverter module, the machine 10 can be viewed as starting with an infeed module 100 and proceeding downstream from that module, there is a scanner module 200, an inverter module 300, a Package Vision Inspection (PVI) 400, a pick-and-place (PNP) module 450, and an outfeed module 500. Associated with the PNP module is a tray module 700 and a taper module 900, one located on each side of PNP module 450. All of these elements are supported on a sub-base 52. The sub-base 52 is located above a storage area 54 which houses the process and control equipment, such as a computer system for controlling the overall operation of machine 10. The storage area 54 is protected by various access doors 56 that provide access to storage area 54. Monitors 851 and 852 are provided for monitoring machine operation.

Figure 2:
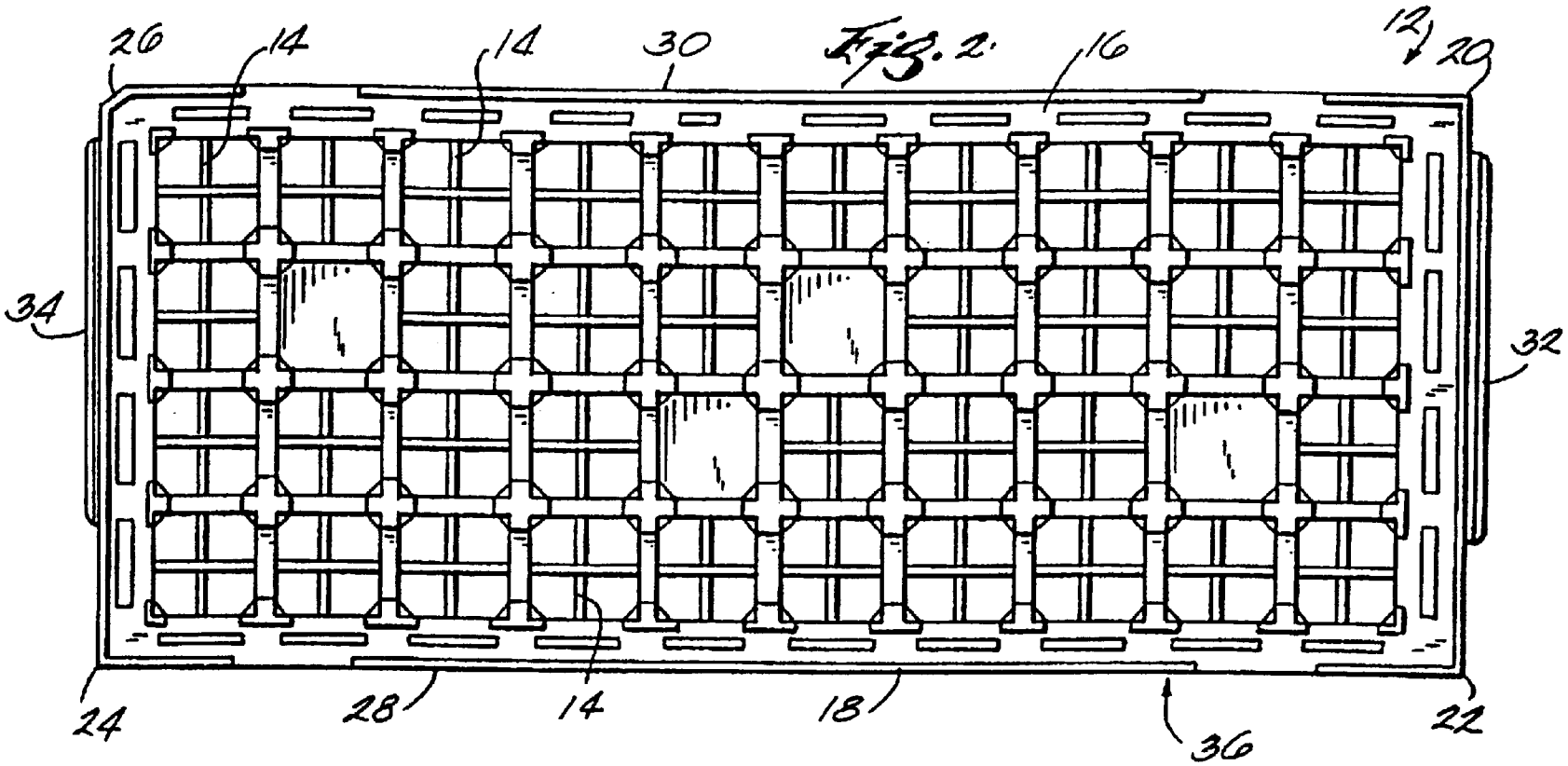
FIG. 2 is a plan view of a typical compartmented tray.

A typical tray 12 is illustrated in FIG. 2. Trays for containing semiconductor devices include JEDEC style trays. The tray 12 has multiple columns and rows of pockets 14 into which devices are housed. Tray 12 include a first surface 16, a second surface 18, a first corner 20, a second corner 22, a third corner 24, a fourth corner 26, a side edge 28, a side edge 30, an end edge 32, an end edge 34 and preferably notches 36 in the side edges 28 and 30. The corner 26 is preferably slightly bevelled and is used to determine the orientation of the tray. The tray 12 is adapted to be transported through inspection handler apparatus 10 leading with end edge 32.

In the tray semiconductor devices such as leaded devices are normally oriented leads down (live bug) and ball grid array (BGA) devices are normally oriented balls up (dead bug).

A number of the trays 12, loaded with semiconductor devices or other types of units, are stacked at the infeed module against columns 11. The stacked trays are supported by singulators 13. The singulators have fingers (not shown), which are extendable from and retractable into the singulators by conventional actuators 99. These actuators can be electrically or pneumatically operated. When a tray is to be delivered to the transport 17, the singulator fingers are retracted and the stack lowers with the lower-most tray engaging transport 17. Fingers 99 are again extended to engage and hold the tray which is second from the bottom and the lower-most, released tray is moved along path 42 by transport 17. Transport 17 includes a belt 19 which carries a pusher 101 and is driven by a reversible stepper motor 21 through a belt assembly 23. The pusher moves a tray 12 from the infeed module to the entrance or staging area for the scanner inspection module 200. The pusher is returned to the left hand of the infeed module to await subsequent delivery of another tray 12 for transport to the scanner module.

Transport guide members 59 and 61 extend from the infeed module a short distance into the scanner module as does transport 17. This cooperates in the transfer of the tray 12 from transport 17 to transport 35.

While in the scanner module, laser unit 25 inspects the upper, exposed surfaces of the semiconductor devices in the tray. The laser is conventional and is moveable on both an x and y axis as illustrated by the arrows 27 and 29, and thus is capable of traversing the entire tray to inspect all of the semiconductor devices.

Movement of the tray into and through the scanner module is accomplished by transport 35, which includes a belt 103 carrying a transport mechanism 105 engageable with the underside of the tray. The belt is driven by a reversible stepper motor 31 and a pulley arrangement 33. Transport 35 delivers the tray to inverter module 300. Guide rails 63 and 65 in the scanner module and the inverter module, respectively, are in line and parallel and further define the linear path 42 as do transports 17 and 35. It will be noted that two trays are illustrated as being in the scanner module at the same. This is the preferred arrangement as it reduces the overall time for processing the trays as is more completely described in U.S. Pat. No. 5,668,630 assigned to the assignee of this application. Reliance is placed on that patent should details of the scanner be necessary to an understanding of this invention.

The operation within the inverter module will be described hereinafter.

Transport 35 extends from the inverter module through the PVI module 400, PNP module 450, to the outfeed module 500 and transports a tray serially through those modules. Guide members 67 and 69, 71 and 73, 75 and 77, and 79 and 81 are generally relatively aligned and parallel to each other and the linear path to further define that path. For convenience, the guide members have been illustrated as separate members in each station. As desired various of the modules may share guide members. All of the guide members associated with all of the modules, including the inverter module, can be adjustable to vary their relative spacing in a direction transverse to linear path 42 to accommodate trays of different widths.

In the PVI module, the surface of the semiconductor devices opposite to the surface inspected in the scanner module is inspected by a conventional camera arrangement 410. As may be required for proper viewing of the semiconductor devices in the tray, the camera arrangement 37 is moveable vertically as illustrated by arrows 41. It is also moveable on an x and y-axis as illustrated by arrows 39 and 43 so that the camera can traverse the entire upper exposed surfaces of all of the semiconductor devices in the tray.

After inspection in the PVI module is complete, the tray is transported to the PNP module 450. The PNP module 450 includes a conventional precisor assembly 45 having a downwardly-projecting vacuum cup 49 with assembly 45 including a conventional vacuum-producing mechanism that cooperates with cup 49 to produce a lifting vacuum.

Assembly 45 is moveable vertically as illustrated by arrows 47 to engage a semiconductor device, remove that device from the tray and transport that device to a preselected area. The semiconductor devices removed can be either a "good" device or "reject" device. The assembly 45 is moveable on a y axis (indicated by arrow 51) to displace the unit from linear path 42. The precisor assembly 45 can move the selected device to a tray station 700, where it will be loaded into another tray. Alternatively, the selected unit may be moved to a taper module 900 where the selected device will be loaded into a carrier tape. When moved to the tray station, the selected unit can be either a "good" or "reject" device. When moved to the taper module, the selected unit will be a "good" device to be packaged in the carrier tape for delivery to a customer for the devices.

The tray station 700 may be of the type commonly used in the industry. For purposes of this application, it should be noted that carrier tape 906 is unwound from a supply reel 908 and drawn past the PNP module 450 where individual devices are placed in each compartment of the carrier tape. Downstream of that placement, a sealing tape (not shown) is adhered to and closes the open surface of the carrier tape. The closed carrier tape is wound onto a spool 912.

Turning now to the inverter module, transport 170 takes a tray as it leaves the scanner module on transport 150. Transport 170 is shown as a continuous assembly moving a tray through the inverter module, PVI module, PNP module and the outfeed module. The inverter module also includes a pair of spaced guide rails 202 and 204 arranged parallel to each other and the linear path 42.

Returning to the inverter module 300, it includes a tray inverter apparatus 302, a base plate 303, and a front and a rear guide rail 508 and 511 mounted on the base plate 303. Guide rails 508 and 511 define a bay area 306 therebetween. The outfeed transport assembly 502 operates to move trays into and out of the bay area 306. The transport assembly 502 receives a tray near a left end 307 of the guide rails 508 and 511 (i.e., from a preceding inspection module) and transports the tray to the bay area 306 where the tray inverter 302 acts on the tray. When a tray is transported to the bay area 306, the tray rests squarely between guide rails 508 and 511 and in a lip 516 of each guide rail 508 and 511. A slide bar assembly 392c on front rail 511 is actuated when the tray is in position and which pushes the tray against back rail 508.

Figure 10:
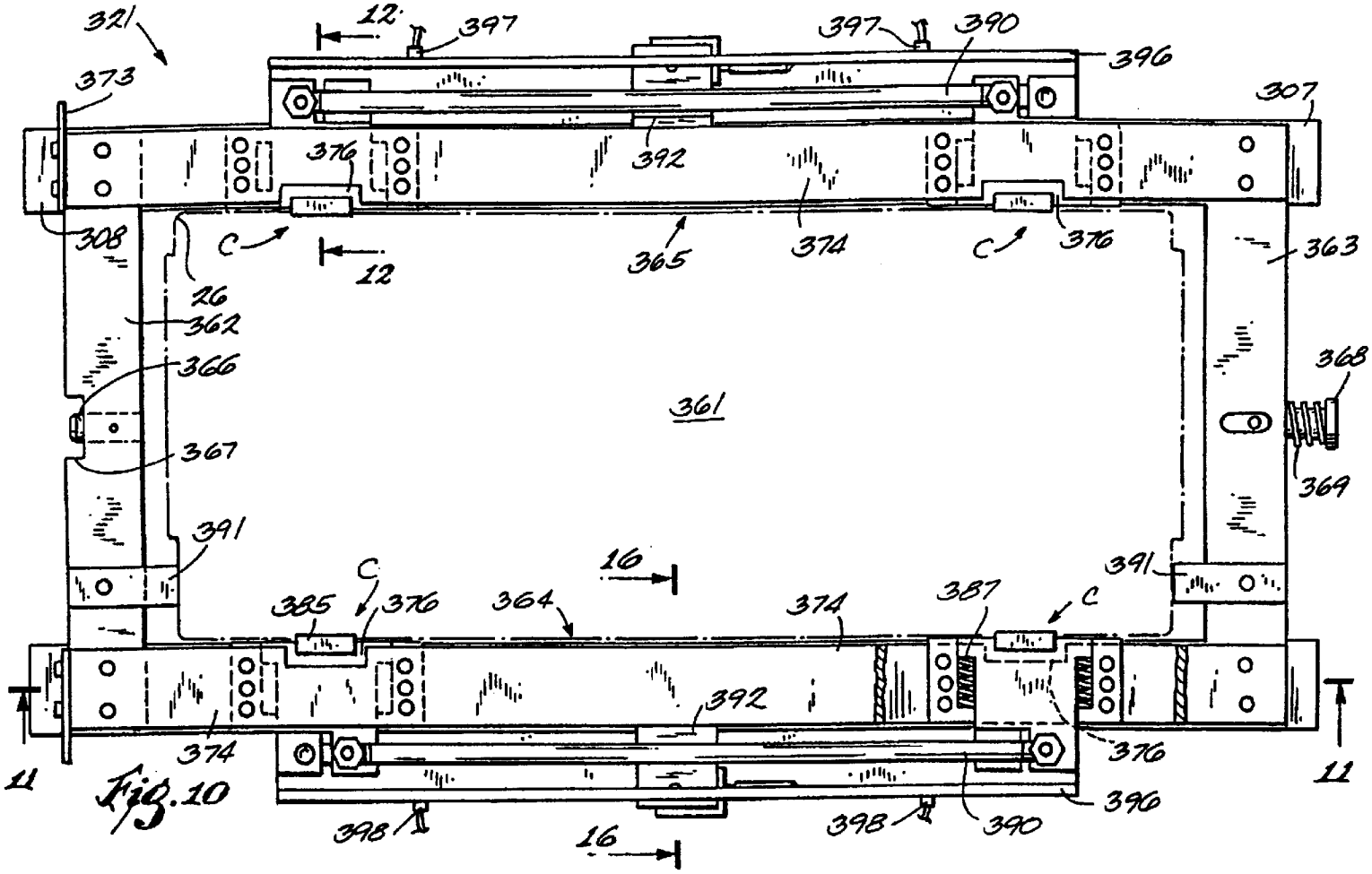
FIG. 10 is a top view of a tray holder shown lowered to a position on top of a pair of guide rails and engaging two device trays that are each disposed in the upside-down position.

Inverter module 300 is adaptable to handle an industry-standard semiconductor inverted or noninverted device tray 12 such as tray 12 depicted in FIG. 2. The tray 12 has a generally flat, rectangular frame 13 with top and bottom faces 16 and 18, end walls 32 and 34, and elongated side walls 28 and 30. Within the frame 13, the tray 12 provides a plurality of segregated pockets 14 designed to accommodate a device of particular dimensions. Each side wall 28 and 30 is equipped with a pair of lifting notches 36 formed along the bottom edge of the side walls 32 and 30 and near the ends. The lifting notches 36 on one side wall 28 are preferably disposed to transversely match the lifting notches 36 on the opposite side wall 30. Thus, device tray 12 may be identified as being disposed in the upside-down position when all four lifting notches 36 are facing upward. Additionally, one corner 26 of the tray 12 is bevelled such that the bevelled corner 26 is preferably positioned in the rear left corner when the device tray 12 is in the upside-down position, as shown in FIG. 10.

The tray inverter includes a fixed support frame 319, a linearly movable frame 320, and a rotatable tray holder 321. The tray holder 321 provides means for selectively engaging and supporting one or two trays simultaneously. Linearly movable frame 320 supports rotatable tray holder 321 while also providing a means for rotating tray holder 321 about a center axis 322 and a means for moving the tray holder 321 in the vertical direction. Preferably, inverter module 300 inverts a tray by rotating it 180 degrees and in a position located vertically above linear path 42. That is, the tray is not moved laterally with respect to the guide rails 508 and 511 and is maintained along and/or above the linear path 42 throughout the inverting operation. The fixed support frame 319 supports the linearly movable frame 320 and various other components of the tray inverter 302. The tray inverter 302 also includes control components that are preferably mounted adjacent the guide rails 508 and 511 or other support locations in the inspection handling apparatus 10.

Figures 5, 8, 9:
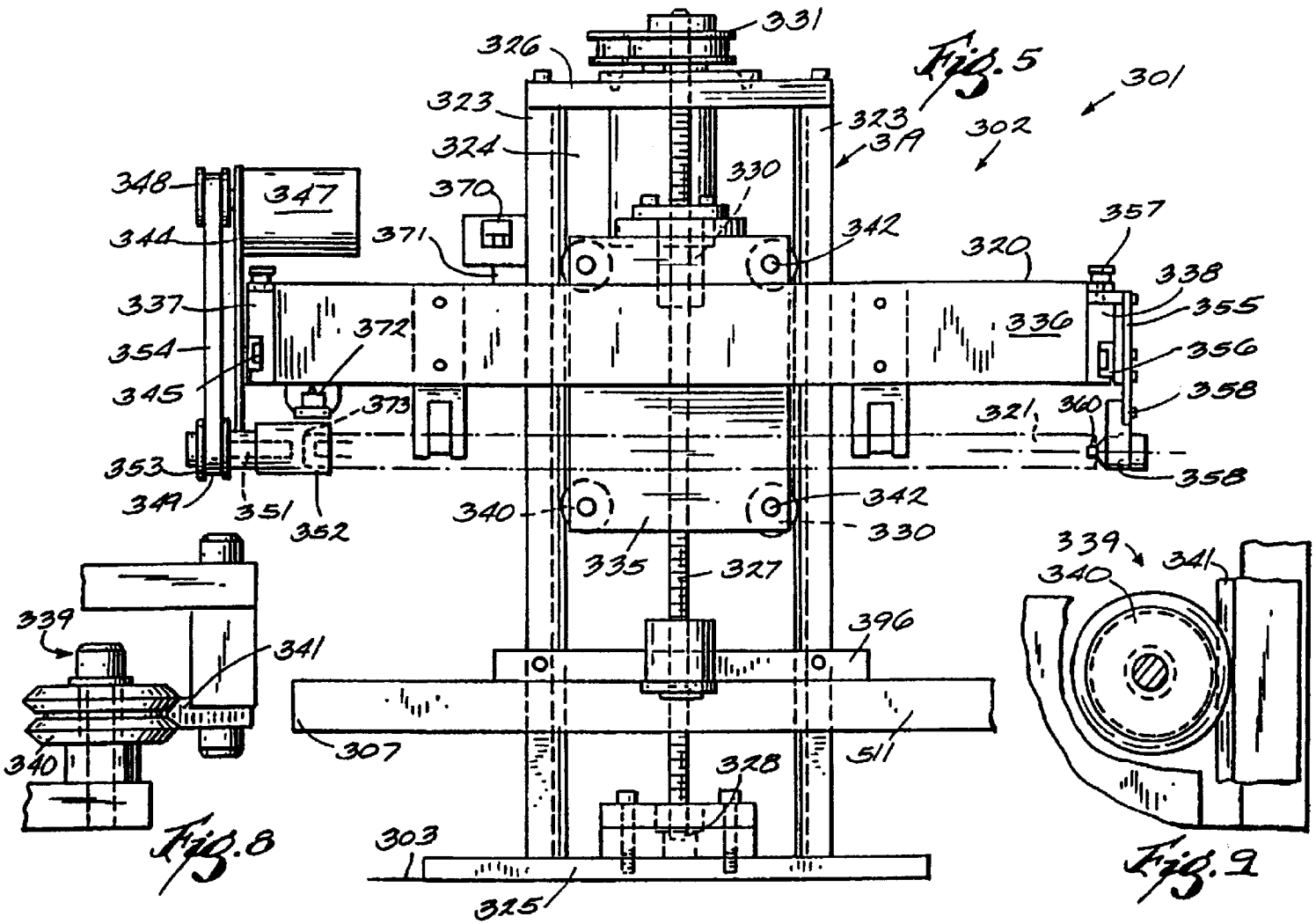
FIG. 5 is a front elevation view of an inverter module including a tray inverter apparatus.
FIG. 8 is a top view of a vertical transport assembly for the tray inverter apparatus.
FIG. 9 is a side view of the vertical transport assembly.
Figure 6:
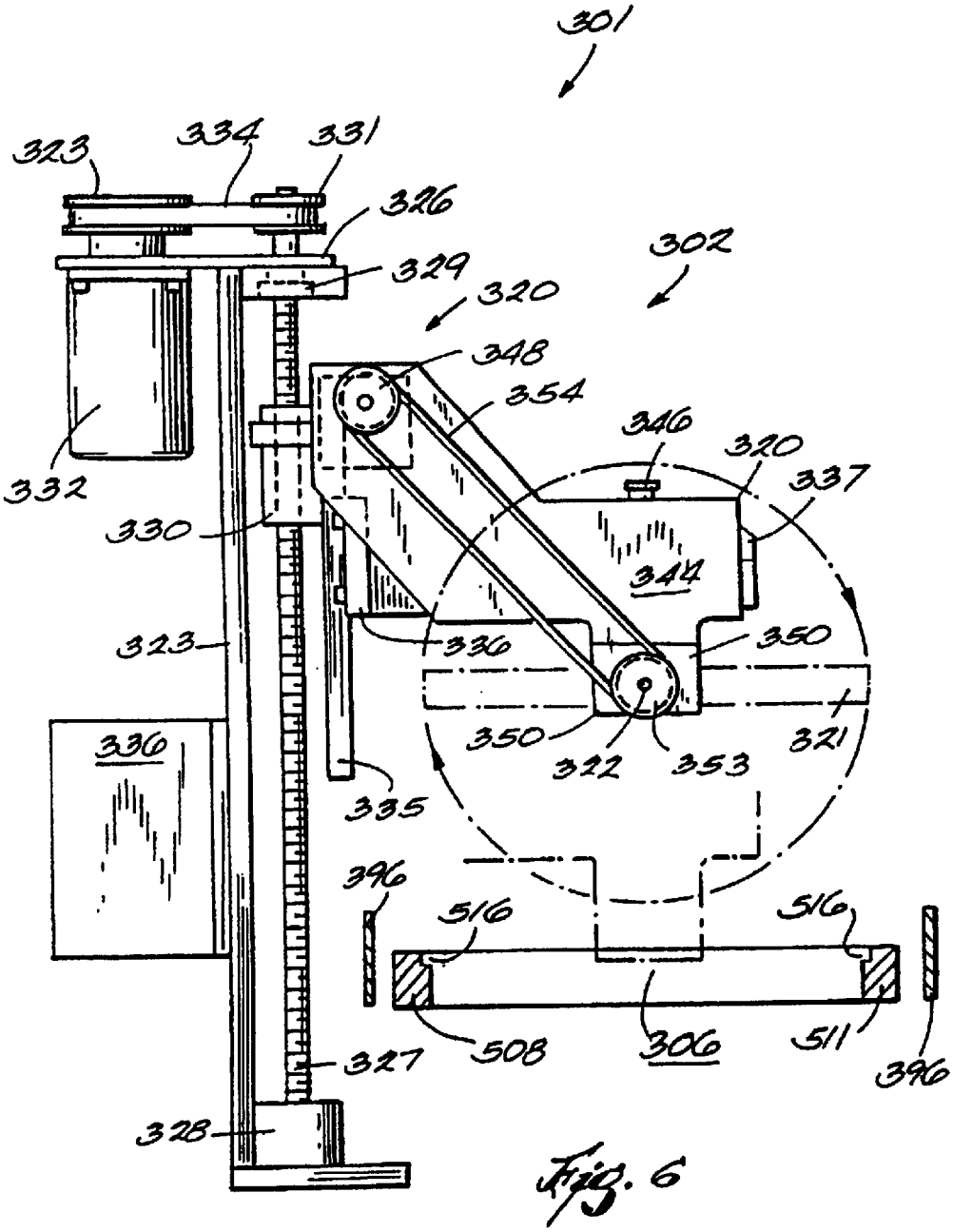
FIG. 6 is a side elevation view of the inverter module.

Referring now to FIGS. 5 and 6, fixed support frame 319 extends vertically from behind the rear guide rail 508 and includes a pair of vertically extending side gussets 323 and a rectangular back plate 324 fastened between the side gussets 323. Side gussets 323 are mounted onto a frame base plate 325 located below rear guide rail 508. A top bearing plate 326 is fastened to the top ends of side gussets 323 and back plate 324. The top bearing plate provides a mounting surface for several components of tray inverter 302.

Forward of back plate 324 and in between the side gussets 323, a vertical screw shaft 327 is rotatably mounted onto a bearing block 328 that is mounted to the frame base plate 325. Screw shaft 327 extends upwardly from bearing block 328 and passes through a flanged bearing 329 mounted on the underside of top bearing plate 326. Below top bearing plate 326, an anti-backlash, self-lubricating nut 330 is movably mounted onto screw shaft 327. A shaft pulley 331 is mounted onto a top end of screw shaft 327. Behind back plate 324, a stepper motor 332 is mounted to the underside of the bearing plate 326. The stepper motor is operably connected to a horizontally disposed drive pulley 333 located above the top bearing plate 326. A timing belt 334 is mounted around drive pulley 333 and shaft pulley 331. Stepper motor 332 is operable to selectively drive screw shaft 327 in either a clockwise or the counterclockwise direction, and to drive nut 330 up or down on screw shaft 327.

Linearly movable frame 320 includes a lift plate 335, a back bar 336 mounted to the lift plate 335, and a pair of stationary arms 337 and 338 attached to right and left ends of back bar 336. Lift plate 335 is fastened directly to the front of the 330, and moves up and down with the 330 upon operation of stepper motor 332. Referring to the top view of FIG. 7, rectangular lift plate 335 is disposed between side gussets 323. Vertical movement of lift plate 335 is guided by a vertical transport assembly 339 comprised of four grooved wheels 340 cooperable with two V-tracks 341.

Referring to FIGS. 8 and 9, two wheels 340 on the right as view in the drawings, are mounted for adjustment on screw operated eccentric bushings 342 that are fastened to the back of lift plate 335, near right corners of the lift plate 335. The other two wheels (on the left) are mounted on fixed axes and are not adjustable. V-track 341 is formed from two upright bars that are each fastened to the front of side gussets 323. One side of the bar is cut to form an angle or "V" (as viewed from the top). The two wheels 340 on each side of lift plate 335 ride up and down on the same "V-track" 341.

It should be noted that the linearly movable frame 320 described herein is adaptable to being driven by alternative motor and transmission means. For example, in alternative embodiments, the linearly movable frame 320 may be moved up and down by a pneumatic cylinder or the like, or vertically transported on vertical rails or a collar-shaft assembly.

Referring back to FIGS. 5 and 6, the back bar 336 is an elongated plate that is mounted to the front of the lift plate 335. The back bar 336 extends in the horizontal direction across the center of the lift plate 335 and to the right and left of the lift plate 335. A stationary arm 337 and 338 is mounted to each end of the back bar 336. Referring to the top view of FIG. 25, the stationary arms 337 and 338 extend forwardly from the back bar 336, over the rear guide rail 508, and over a longitudinal center line 343 of the bay area 306.

Figure 7:
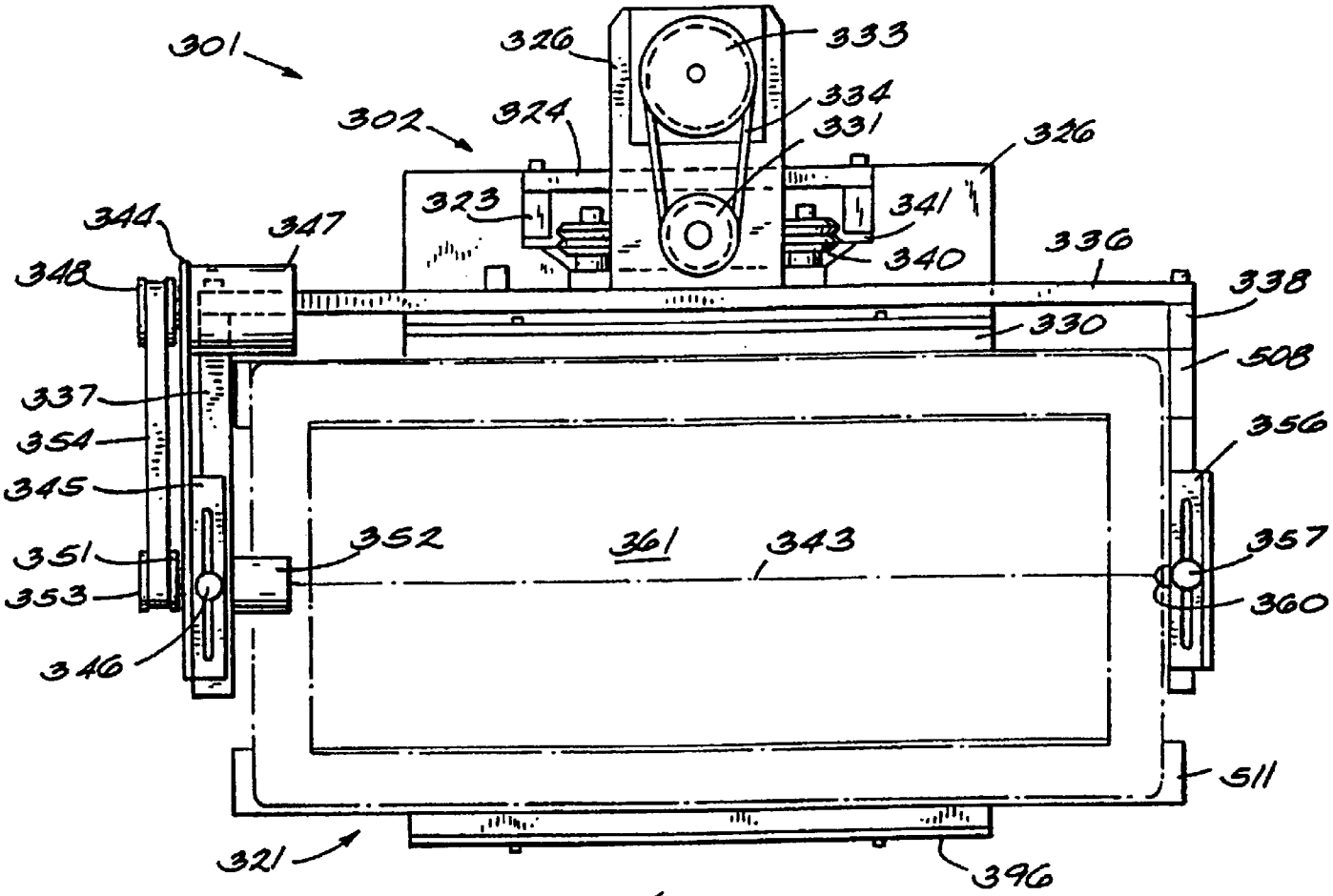
FIG. 7 is a top view of the inverter module.

Referring to FIGS. 6 and 7, a motor mounting plate 344 is mounted to the left side of left stationary arm 337 by a linear slide assembly 345 and a center point adjustment screw 346. Thus, motor mounting plate 344 may be fixedly secured to left stationary arm 337 by tightening center point adjustment screw 346. Conversely, the position of motor mounting plate 344 relative to the left stationary arm 337 may be adjusted by loosening center adjustment screw 346 and sliding motor mounting plate 344 across linear slide 345. Guided by linear slide 345, the motor mounting plate 344 may be moved in a direction forward or rearward of the back bar 336.

Referring to the side view of FIG. 6 and the top view of FIG. 7, the motor mounting plate 344 extends downwardly and forwardly from the back bar 336. A horizontally disposed gear motor 347 is mounted to an upper portion of motor mounting plate 344 and operably connected to a drive pulley 348 rotatably mounted on the left side of the motor mounting plate 344 (see FIG. 6). Further, a left pivot bearing block 349 is fastened to a lower flange 350 of motor mounting plate 344. The left pivot bearing block 349 rotatably supports a horizontally disposed shaft 351. A rotate adapter 352, a disk with a central bore, is fixedly mounted to shaft 351 on the right of left pivot bearing block 349 and a timing pulley 353 is mounted to the shaft 351 on the left of motor mounting plate 344. The timing pulley 353 is operably connected to drive pulley 348 by a timing belt 354. Thus, gear motor 347 is operable to rotate the rotate adapter 352 and any member securely fastened to the rotate adapter 352, i.e., the tray holder 321.

A side mounting plate 355 is similarly mounted to right stationary arm 338 by a right linear slide assembly 356 and a right center point adjustment screw 357. A right pivot bearing block 358 is securely fastened to a lower flange 359 of the right side mounting plate 355. Whereas left pivot bearing block 349 supports a shaft 351 with a rotate adapter 352 mounted thereon, right pivot bearing block 358 fixedly supports a horizontally disposed fixed pivot pin 360. By utilizing linear slide assemblies 345 and 356, the rotational axes of the rotate adapter 352 and fixed pivot pin 360 may be aligned, and the rotational axis of the tray holder 321 may be adjusted to accommodate trays of different widths. Such an adjustment of the rotational axis is typically made in conjunction with adjustment of the front guide rail 511 to modify the width and centerline 343 of the bay area 306. In this way, the rotational axis of the tray holder will always be located directly above the linear path 42.

Referring to FIG. 10, rotate adapter 352 and fixed pivot pin 360 are engageable with the tray holder 321 to support tray holder 321 between right and left stationary arms 337 and 338, and directly above guide rails 508 and 511. Generally rectangular in shape, tray holder 321 comprises four link members that bound an open inside area or tray area 361 therebetween. The four link members consists of a left side bar 362, a right side bar 363, a front cover plate assembly 364, and a rear cover plate assembly 365. At a location midway on the left side bar 362, a dowel 366 is embedded in left side bar 362 projects horizontally outward from a cutout section 367 on the outside of left side bar 362. Rotate adapter 352 mates with cutout section 367 and engages dowel 366.

Directly across the tray area 361 from the dowel 366, a horizontally disposed plunger 368 is seated inside the right side bar 363 and projects outward from the right side bar 363. Fixed pivot pin 360 engages a bore of plunger 368 such that the plunger 368 is rotatable about fixed pivot pin 360 when tray holder 321 is rotated. A spring 369 attached around plunger 368 biases plunger 368 in the direction of fixed pivot pin 360, thereby forcing tray holder 321 toward the left and ensuring a tight fit. Plunger spring 369 also facilitates removal of tray holder 321 from engagement with rotate adapter 352 and linearly movable frame 320.

As illustrated in FIG. 6, linearly movable frame 320 is adapted to maintain tray holder 321 substantially horizontal between stationary arms 337 and 338 as linearly movable frame 320 is moved vertically over bay area 306. Moreover, gear motor 347 is operable to rotate tray holder 321 through 360° while supported between stationary arms 337 and 338 and while supported over bay area 306. In alternative embodiments, the rotate adapter-dowel connection and/or the fixed pivot pin-plunger connections may be replaced with other connector elements, e.g., quick lock fittings, a shaft and a sleeve secured together by a set screw, or a squared shaft and groove.

It should also be noted that in alternative embodiments, linearly movable frame 320 may be configured such that the rotational axis of tray holder 321 is disposed perpendicular to guide rails 508 and 511. In this embodiment, stationary arms 337 and 338 may be replaced by a frame including rear and front support beams, e.g., a box frame, wherein rotate adapter 352 and pivot pin 360 are mounted on rear and front support beams, respectively.

Referring to FIG. 10, a vertical home photo sensor 370, for example, a U-type photoelectric sensor, is preferably mounted on side gussets 323 facing back bar 336. A vertical home flag 371 mounted on back bar 336 cooperates with the home photo sensor 370 to indicate when the back bar 336 is at its high or vertical home position. A similar photo sensor, referred to as a rotate home photo sensor 372, is preferably mounted on a lower left portion of the back bar 336. The rotate home photo sensor 372 cooperates with a vertical home flag 373 mounted on a designated corner of the tray holder 321 to determine a home rotate position for tray holder 321. Accordingly, rotate home photo sensor 372 indicates whether a tray(s) supported within the tray holder 321 are in the upright or upside-down position.

Figure 11:
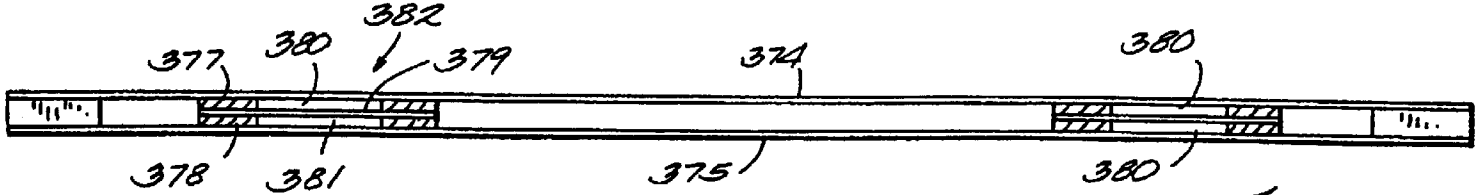
FIG. 11 is a sectional view through line 11—11 in FIG. 10.

The front and rear cover plate assemblies 364 and 365 of tray holder 321 are substantially identical in structure and function. Referring now only to front cover plate assembly 364, as depicted in FIGS. 5 through 12, the front cover plate assembly 364 comprises a top cover plate 374 and a bottom cover plate 375. Both cover plates 374 and 375 are equipped with two identical squared cutouts 376 that face tray area 361 (see FIG. 10). The squared cutouts 376 on the top cover plate 374 are vertically aligned with the squared cutouts 376 on bottom cover plate 375. Referring to FIG. 10, a pair of block assemblies 382 is mounted between the top and bottom cover plates 374 and 375, near each cutout 376. Each block assembly 382 includes two pairs of matching lower and upper blocks 377 and 378, or shims, that are horizontally spaced equidistantly from a vertical centerline of the cutouts 376. A horizontally disposed middle plate 379 extends between each pair of lower and upper blocks 377 and 378, so as to divide the space between the block assemblies 382 into a lower sleeve 380 and an upper sleeve 381. The lower sleeve 380 is disposed below upper sleeve 381 when tray holder 321 is oriented in the home rotate position as illustrated in FIGS. 10 and 11.

Each of the four lower sleeves 380 of the tray holder 321 accommodates a lower pawl 382, while each of the four upper sleeves 381 accommodates an upper pawl 383. This provides four sets of clamp members C, each having two vertically spaced clamp arrangements as will be described in more detail. Referring to FIG. 28, each pawl 382 and 383 includes a generally flat body 382a and 382b that extends through the sleeve 380 and 381. A clamp 384 and 385 is attached to the pawl body 382a and 382b and occupies a portion of the area defined by the cutout 376. Each clamp 384 and 385 preferably has a leading edge or lip 384a and 384b that is bent in a direction away from the middle plate 379. Each lip 384a and 384b facilitates engagement and disengagement with the trays. Lower pawls 382 further include a leading edge of pawl body 382a that acts as a second clamp or inside clamp 386.

Figure 12:
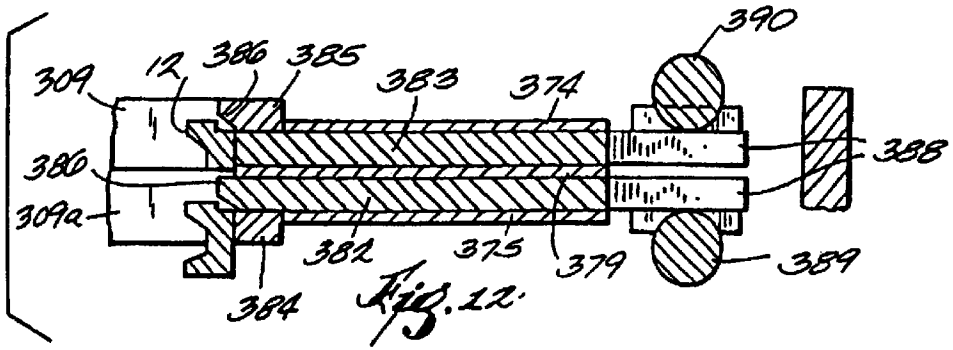
FIG. 12 is a partial sectional view through line 12—12 in FIG. 10.
Figure 16:
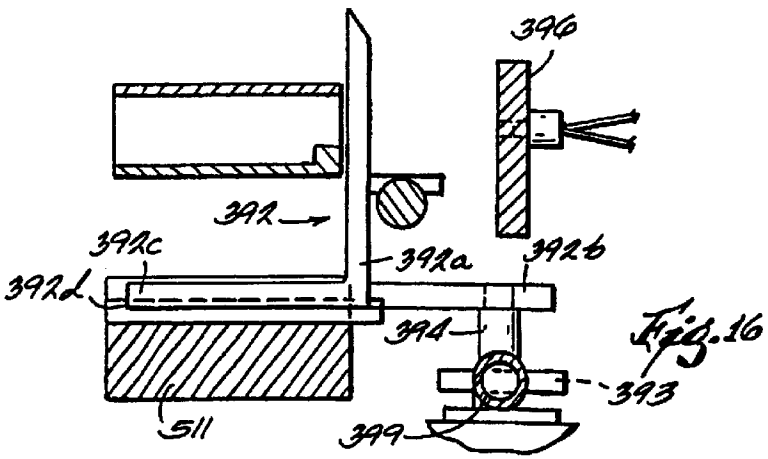
FIG. 16 is a partial sectional view through line 16—16 in FIG. 10.

Referring to FIG. 12, inside clamp 386 is disposed between single clamp 385 of upper pawl 383 and outside clamp 384 of lower pawls 382. Further, two latch springs 387 disposed inside each sleeve 380 and 381 and operatively engaged with the pawl body, bias the pawl 382 and 383 inwardly such that the clamp(s) normally project into the tray area.

Figure 13:
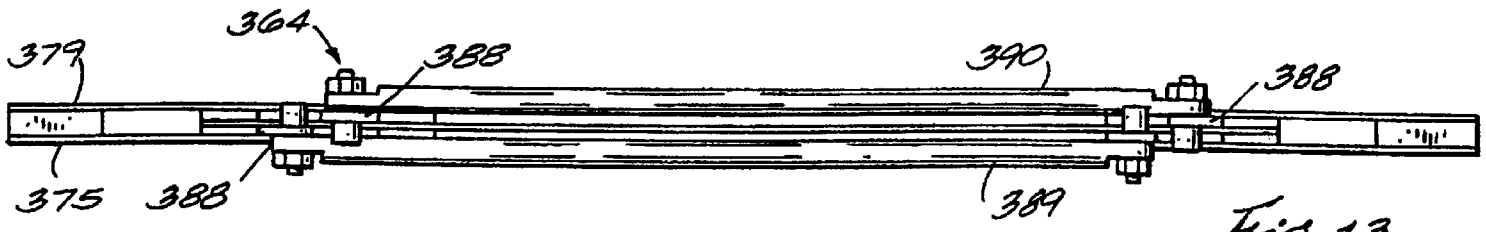
FIG. 13 is a front elevation view of a tray holder and front guide rail in FIG. 10.

Referring to FIGS. 10 and 31, each pawl 382 and 383 further includes a pawl flange 388 that extends outwardly from the sleeve 380 and 381 and connects to an end of two horizontally disposed cross bar 389 and 390. The tray holder 321 is equipped with a total of four cross bars; a pair of lower and upper cross bars 389 and 390 on the front and a second substantially identical pair of lower and upper cross bars 389 and 390 on the rear. The upper cross bars 390 are fastened to the flanges 388 of the upper pawls 383, and the lower cross bars 389 are fastened to the flanges 388 of the lower pawls 382. The upper cross bars 390 are disposed directly above and parallel to the lower cross bars 389. Both cross bars 389 and 390 are disposed substantially parallel to the cover plate assembly 364. A vertical gap is provided between upper and lower cross bars 389 and 390 (see FIG. 13). A horizontal gap is provided between cross bars 389 and 390 and outside of cover plate assemblies 364.

FIGS. 10 and 12 illustrate the upper and lower pawls 382 and 383 engaging two trays 309 and 309a to secure the trays 309 and 309a within the tray holder 321. The trays 309 and 309a are disposed in the upside-down position, as indicated by the bevelled corner 26 of the trays 309 and 309a being located in the rear left corner. The lifting notches 36 on each tray 309 and 309a are facing up. The clamps 385 of upper pawls 383 engage lifting notches 36 on the top tray 309. For lower pawls 382, inside clamps 386 engage the lifting notches 36 of the bottom tray 309a while outside clamps 385 engage the bottom edge of the bottom tray 309a.

Proper fit of trays 309 and 309a is also facilitated by edge guides 391 that are fastened on the inside of each side bar 362 and 363 (see FIG. 10).

Once trays 309 and 309a are secured by respective ones the pawls 382 and 383 of the four sets of clamps, the edge guides 391 prevent lengthwise tray movement. Each edge guide 391 provides a vertically disposed face upon which end walls 32 and 34 of trays 309 and 309a abut.

The edge guides 391 are preferably mounted on the side bars 362 and 363 such that the blocks face each other, as shown in FIG. 28. A horizontal flange portion of each guide 391 is fastened to side bar 362 and 363 by a bolt and lock washer or equivalent fastening means. Thus, guides 391 may be adjusted to accommodate a change to trays of shorter or longer lengths.

Referring to FIG. 10, a front lever 392 and a rear lever 392 are mounted to the front guide rail 511 and rear guide rail 508, respectively. The rear and front levers 392 and associated components mounted adjacent to the rear and front guide rails 508 and 511 that respond to or impact levers 392, are generally identical in structure and function. Accordingly, only the components associated with front lever 392 and front guide rail 511 are discussed herein.

Figure 14:
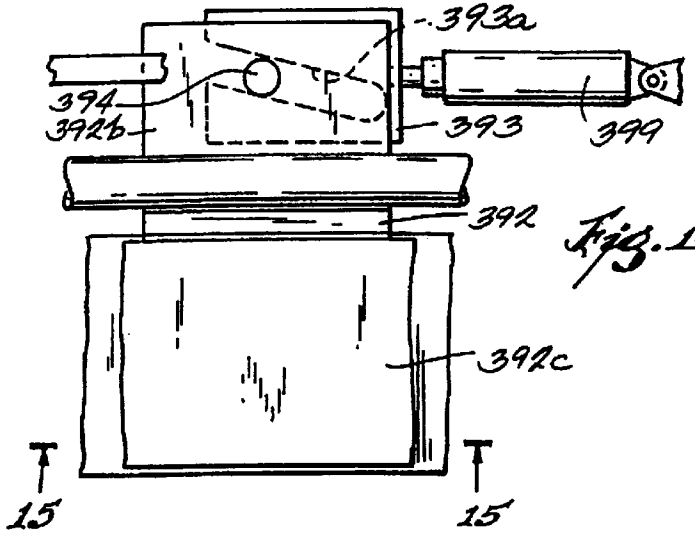
FIG. 14 is a top view of a lever and a cam.
Figure 15:
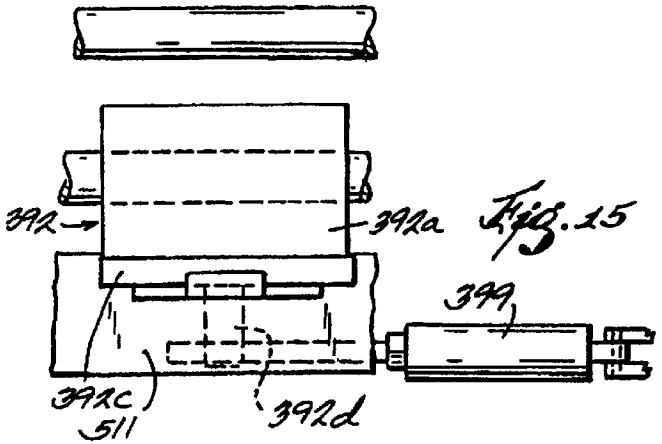
FIG. 15 is a partial sectional view through line 15—15 in FIG. 14.
Figure 11:
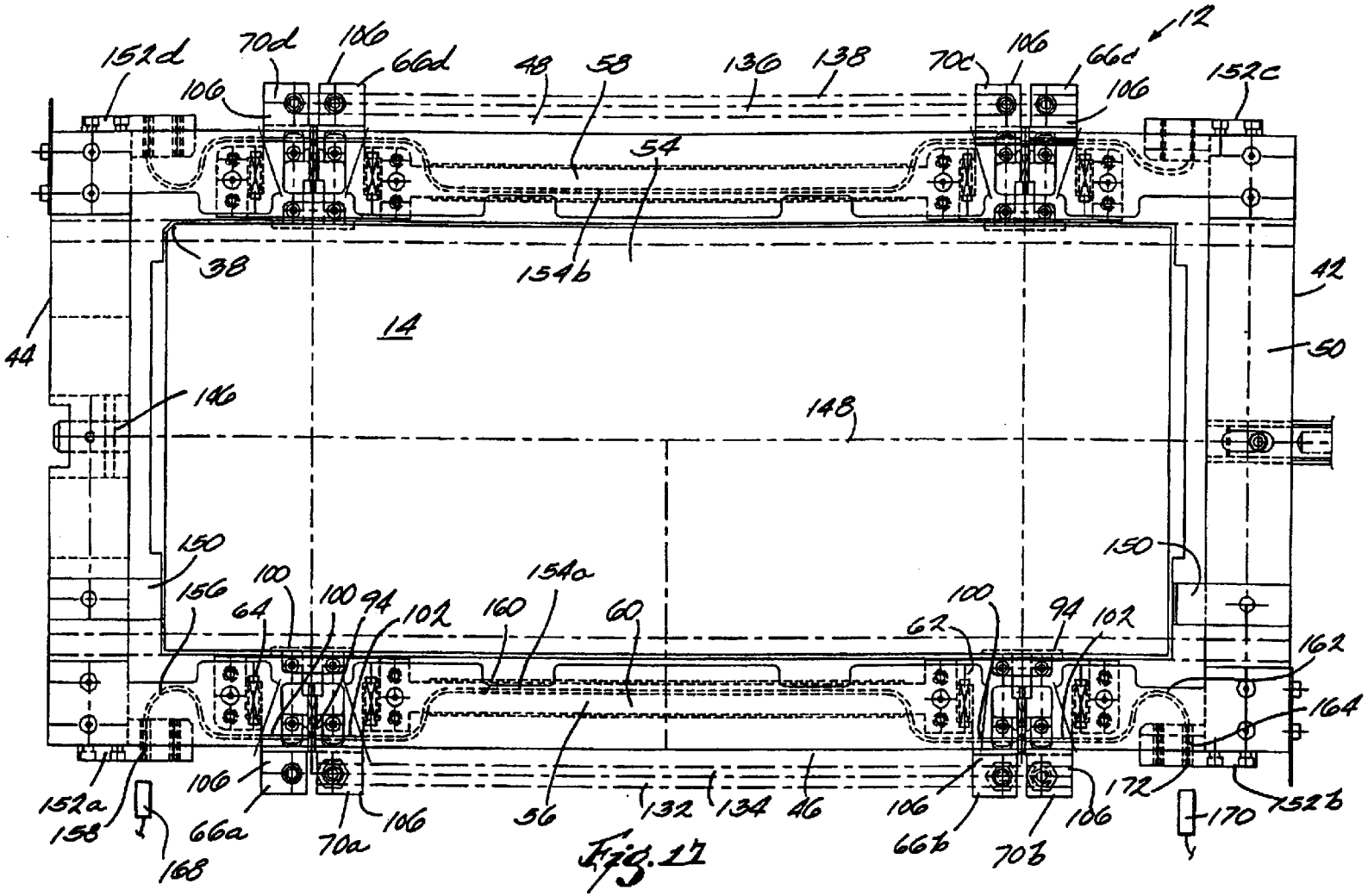

Referring to FIGS. 14 through 14, the front lever 392 comprises a vertical section 392a and a horizontal base 392b that extends forward of the vertical section (in a direction away from front guide rail 511). A horizontally disposed slide bar 392c is attached to the back of lever 392, opposite horizontal base 392b. The slide bar 392c extends into a channel across the top of the front guide rail 511. The slide bar 392c is movable in the channel via a linear slide assembly 392d interfacing the bottom of slide bar assembly 392c and the channel. Slide bar assembly 392c is also used to locate the tray against the back rail after the tray enters an inverted position. Further, a generally bar-shaped linear cam 393 is disposed beneath the horizontal base 392b. The cam 393 is driveable by a pneumatic cylinder 399 along the linear path 42 generally perpendicular to the linear path of the slide bar 392c. The cam surface of the cam 393 consists of a horizontal slot 393a that extends diagonally with respect to the linear path of the cam 393. A follower bearing 394 attached to the horizontal base 392b engages the slot 393a such that movement of the cam 393 imparts motion to the lever 392. When the cam 393 is forced leftward by the pneumatic cylinder 399, the cam 393 forces the lever 392 to slide away from the front guide rail 511. When the cam 393 is retracted, the lever 392 is forced to slide forward, toward the front guide rail 511.

When the tray holder 321 is brought down to engage the guide rails 508 and 511, both levers 392 extend upwardly into the horizontal gap between the lower cross bar 389 and the lower cover plate 364, if the tray holder 321 is in the home rotate position as in FIG. 28, or between the upper cross bar 390 and the upper cover plate 364 of the tray holder 321 is disposed 180° from the home rotate position. When the cam 393 is actuated, the levers 392 push the cross bars 389 outward against the resistant force of the latch springs 387 and cause the lower pawls 382 to disengage from the bottom tray. When the pneumatic cylinder 399 deactuates the cam 393, the latch springs 387 force the lower pawls 382 and the cross bars 389 to return to their normal positions.

Referring to FIGS. 5 and 10, a sensor mounting wall 396 is disposed forward of the lever 392 and cam 393. An upper photo sensor 397 and a lower photo sensor 398 are mounted on the sensor mounting wall 396 at different elevations, but both pointing in a horizontal direction over the front guide rail 511. When the tray holder 321 is disposed in the low position, engaging the guide rails 508 and 511, the lower photo sensor 398 senses the bottom tray 309a in the tray holder 321 and the upper photo sensor 397 senses the top tray 309 in the tray holder 321.

In operation, the inverter module 300 receives a filled device tray that is in the upside-down position and that supports devices, such as semiconductor devices in the dead bug position. Provided below is one example of a programmed series of stages of the inverter operation which results in the semiconductor devices being inverted, so as, for example to be supported in the live bug position.

Stage 1. The lift plate 335 is positioned in the vertical home position with the vertical home flag 373 engaging the vertical home photo sensor 370 and the tray holder 321 is oriented in the home rotate position with the rotate home flag 371 engaging the rotate home photo sensor 372. The tray holder 321 engages a single empty tray by the lower pawls 382. This is a prepositioned empty tray which awaits the arrival of a filled or carrier tray. The prepositioned tray is in the upside down position with the lifting notches 36 facing up. A second, carrier tray has been transported from the left side of the guide rails 508 and 511 to the bay area 306 and is then pushed to the back rail 508 to properly orient the tray. The filled carrier tray is also in the upside-down position, but supports semiconductor devices in the dead bug position. The lower photo sensor 398 senses that tray is disposed in the bay area 306.

Stage 2. The stepper motor 332 is operated to drive the screw shaft 327 so as to lower the tray holder 321 until the prepositioned tray engages the carrier tray. The upper photo sensor 397 senses one tray above the other. The pneumatic cylinders 399 actuates the cams 393 and the levers 392 push the lower cross members 389 outward, thereby releasing the lower pawls 382 from prepositioned tray.

Stage 3. The tray holder 321 is lowered further to its low position, while the lower cross member 389 remain pushed outward by the levers 392. The upper pawls 383 come to rest on the lifting notches 36 on the prepositioned tray. Then, the cams 393 are deactuated and the lower cross member 389 are released by the levers 392. Accordingly, the lower pawls 382 spring back to engage the carrier tray, wherein the inside clamps 386 of the lower pawls 382 simultaneously engage the lifting notches 36 of the carrier tray and the bottom of the prepositioned tray.

Stage 4. The tray holder 321, now securing both the prepositioned tray and the carrier tray in the upside-down positions, is raised vertically. When the vertical home flag 373 engages the vertical home photo sensor 370, operation of the stepper motor 332 is ceased. The lift plate 335 is now in the vertical home position.

Stage 5. The gear motor 347 is operated to rotate the tray holder 321 through 180°, with both trays secured therein. This results in both trays being disposed in the upright position, and with the prepositioned tray disposed below the carrier tray. The tray holder 321 is no longer in the home rotate position. The semiconductor devices are now supported by the prepositioned tray and are in the live bug position.

Stage 6. The tray holder 321 is lowered until the prepositioned tray (now below the prior carrier tray) engages the guide rails 508 and 511. The upper photo sensor 397 senses the upper tray. The levers 392 are actuated to push the upper cross bars 390 outward (which are now below the lower cross bars), thereby releasing the prepositioned tray. Having been previously rotated through 180°, the prepositioned tray is now disposed in the upright position and supports the semiconductor devices in the live bug position and becomes a carrier tray to move through the downstream modules.

Stage 7. Supporting only the empty tray by the lower pawls 382 which are now disposed above the upper pawls 383, the tray holder 321 is raised vertically to its vertical home position. The cams 393 and the levers 392 are deactuated. Meanwhile, the new carrier tray is transported by the outfeed transport assembly 502 from the bay area 306 to the PVI module 400. The emptied carrier tray 2 is now in the upright position and the lower pawls 382 are above the upper pawls 383.

Stage 8. The gear motor 347 is operated to rotate the empties carrier tray through 180°. This results in that tray being disposed in the upside down position again and it now becomes the prepositioned tray. A subsequent, filed carrier tray is transported to the bay area 306 from the left side of the inverter module 300. This begins a second series of stages that are identical to the first, except different trays are acted upon.

The above described operation describes only one application of the inverting method and apparatus of the taper module 300. Other sequences of steps may be employed to accomplish the inversion of the devices.

An alternative embodiment of the holder for the tray in the inversion module is illustrated in FIGS. 17–26. Some of the description of that alternative will be repetitious of the previously described embodiments in order that the common features of the two will be evident. Also it will make it apparent as to how some of the features of the alternative are applicable to the previously described embodiment.

Referring to FIG. 17, a tray inverter assembly 12 embodying the invention is shown. The assembly 12 is used in conjunction with a tray inverter mechanism for inverting devices semi-constrained in compartmented trays. The assembly 12 can be used with various types of compartmented trays.

Figure 24:
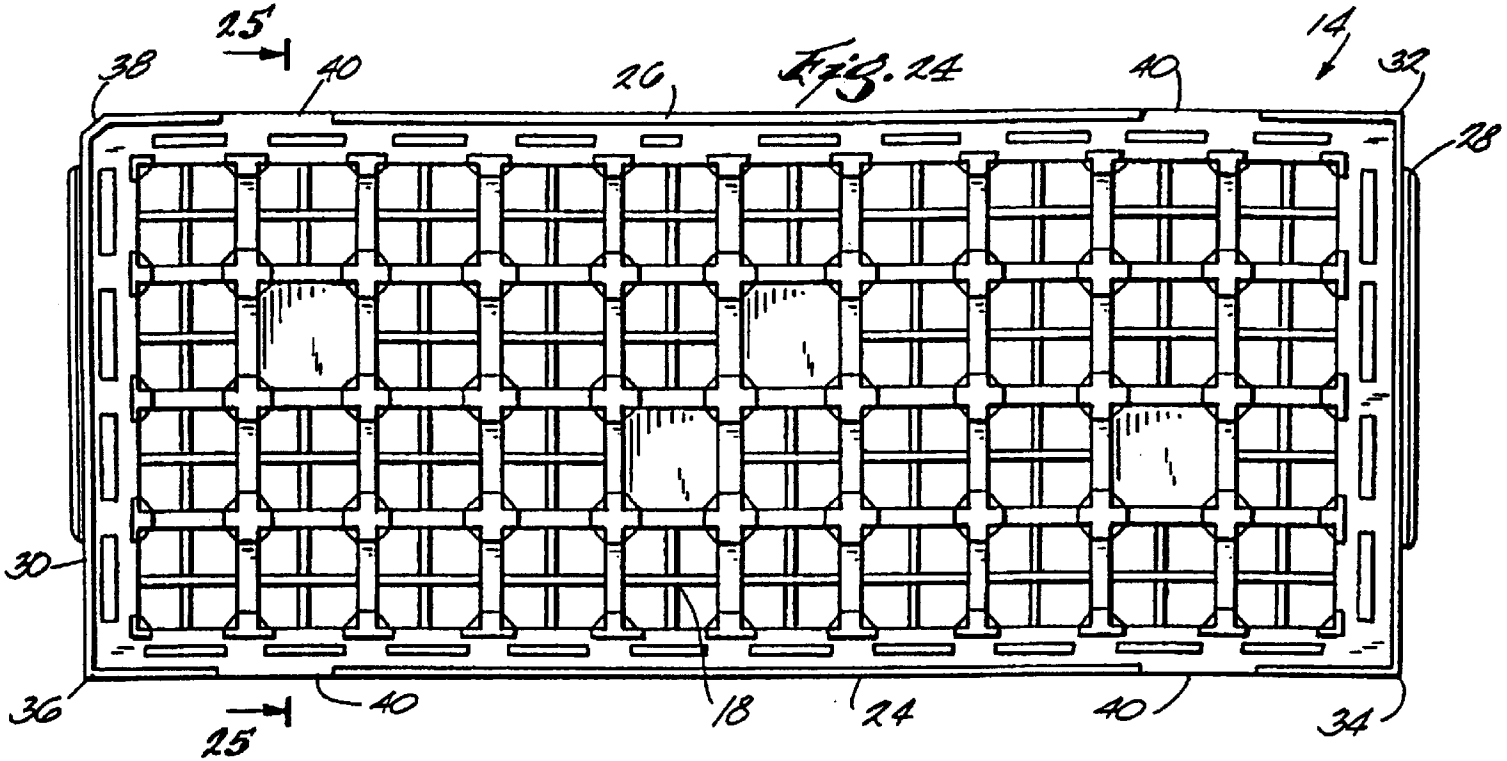
FIG. 24 is a plan view of a tray.
Figure 25:
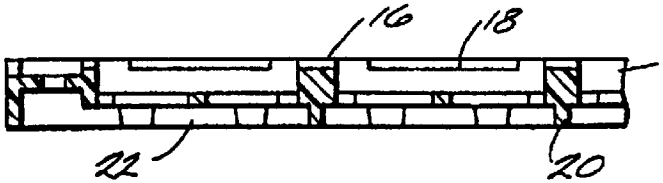
FIG. 25 is a sectional view taken along line 25—25 of FIG. 24.
Figure 26:
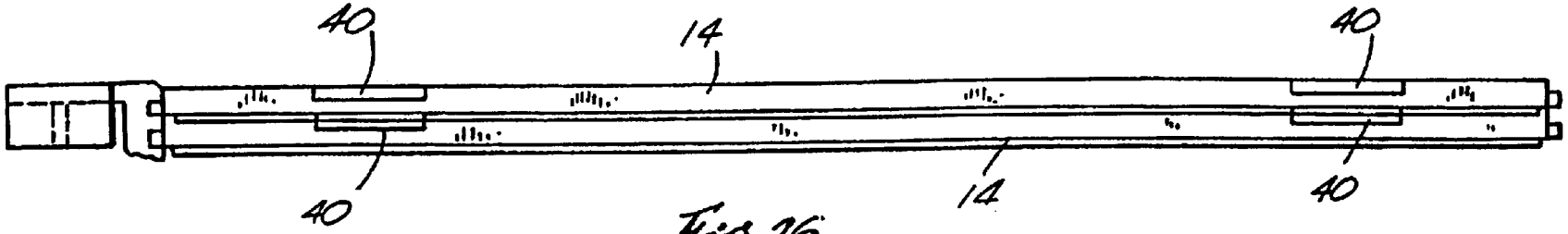
FIG. 26 is a side view of two nested trays.

A typical tray 14, similar to that previously described, for use with the assembly 12 is shown in FIGS. 24 and 25. The tray 14 is generally rectangular although the tray can be of varying shapes. The tray 14 has a first or top face 16 having therein a plurality of pockets 18. The tray 14 has a second or bottom face 20 having therein a plurality of pockets 22. The pockets 18 and 22 are preferably arranged in multiple columns and rows on their respective faces 16 and 20. The devices can be housed in the pockets 18 or in the pockets 22. The tray 14 includes a side edge 24, a side edge 26, an end edge 28, an end edge 30, a corner 32, a corner 34, a corner 36 and a corner 38. Preferably, the corner 38 is bevelled and is used to determine the orientation of the tray 14. As best shown in FIG. 26, each side edge 24 an 26 has therein two recesses or notches 40. The tray 14 nest together with the bevelled corners 38 adjacent one another when stacked one upon another.

Referring back to FIG. 1, the assembly 12 functions to releasably secure one or two trays 14 at a time within the assembly 12 while the trays are being inverted, i.e. rotated through 180 degrees. Preferably, the assembly 12 is designed to accommodate one width of tray, i.e. the distance between the side edge 24 and the side edge 26. However, the assembly 12 can also be constructed to be adjustable and thus enable one assembly 12 to accommodate varying widths of trays 14.

With reference to FIG. 17, the assembly 12 has a pair of ends 42 and 44 and a pair of sides 46 and 48 and further includes a pair of generally rectangular, spaced cover plates 50 and 52 (plate 52 best shown in FIG. 19). The cover plates 50 and 52 defines a tray bay 54 which is an area in which one or two trays 14 are held. As shown in FIG. 1, the bay 54 is filled with a tray 14. A pair of stiffener bars 56 and 58 are positioned between the cover plates 50 and 52, with one bar 56 positioned adjacent to and generally parallel with the side 46 of the assembly 12 and the other bar 58 positioned adjacent to and generally parallel with the side 48 of the assembly 12. Each bar 56 and 58 includes a central elongate portion 60 bounded by a pair of generally rectangular end portions 62 and 64.

Four upper pawl assemblies 66a, 66b, 66c and 66d are housed between the cover plates 50 and 52, with the two assemblies 66a and 66b being adjacent the bar 56 and the other two assemblies 66c and 66d being adjacent the bar 58. Preferably, the four upper pawl assemblies 66a–d are identical. The upper pawl assembly 66a is axially aligned across the bay 54 with the upper pawl assembly 66d and the upper pawl assembly 66b is axially aligned across the bay 54 with the upper pawl assembly 66c, so that the two sets of aligned upper pawl assemblies 66a/66d and 66b/66c are generally parallel to each other.

Likewise, two lower pawl assemblies 70a and 70b are housed between the bar 56 and the cover plate 52 and two lower pawl assemblies 70c and 70d are housed between the bar 58 and the cover plate 52. The four lower pawl assemblies 70a–d are partially hidden from view by the upper pawl assemblies 66a–d in FIG. 1. Preferably, the four lower pawl assemblies 70a–d are identical and the lower pawl assembly 70a is axially aligned across the bay 54 with the lower pawl assembly 70d and the lower pawl assembly 70b is axially aligned across the bay 54 with the lower pawl assembly 70c, so that the two sets of aligned lower pawl assemblies 70a/70d and 70b/70c are generally parallel to each other.

The four lower pawl assemblies 70a–d are oriented between the cover plates 50 and 52 so as to be vertically axially aligned with a corresponding upper pawl assembly 66a–d, respectively. Accordingly, a pair of aligned upper and lower pawl assemblies 66a/70a, 66b/70b, 66c/70c or 66d/70d which are separated by either the bar 56 or 58 are positioned between the cover plates 50 and 52 in four locations.

Figure 18:
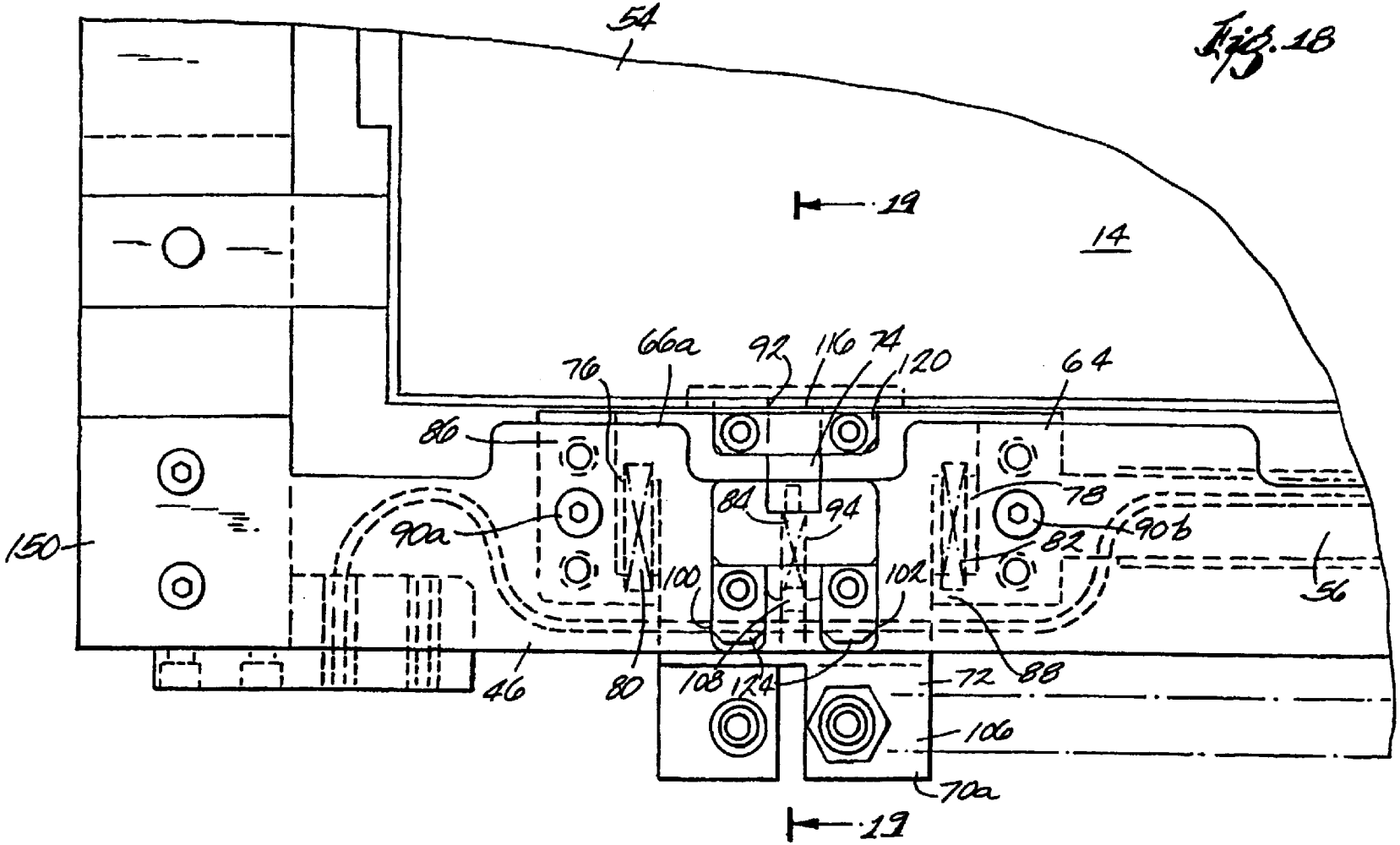
FIG. 18 is an enlarged partial view of the tray inverter holder assembly as shown in FIG. 17.
Figure 12:
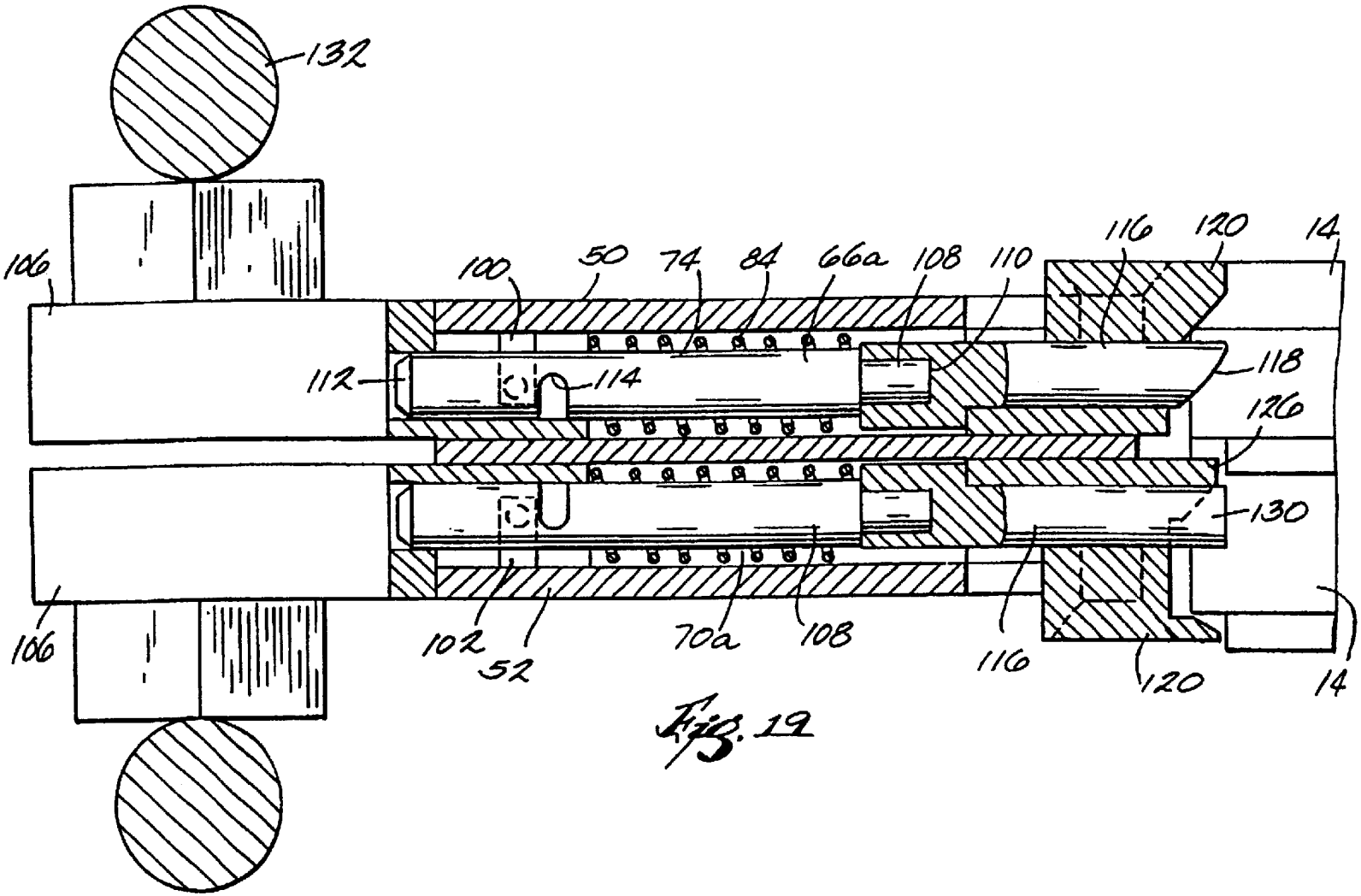

Referring now to FIG. 18, one of the upper pawl assemblies 66a is shown in enlarged detail. Since the four upper pawl assemblies 66a–d are preferably identical, only the upper pawl assembly 66a will be described hereafter. The upper pawl assembly 66a includes an outer pawl 72, an inner pawl 74, a pair of mounting blocks 76 and 78, a pair of outer springs 80 and 82 and an inner spring 84. As will be explained below, the outer pawl 72 and inner pawl 74 are selectively moveable as a unit with respect to the cover plates 50 and 52 and the inner pawl 74 is selectively moveable with respect to the outer pawl 72. Preferably, the outer springs 80 and 82 have a higher spring rate than does the inner spring 84.

The mounting blocks 76 and 78 are spaced relative to each other and are positioned one block adjacent each end of the end portion 62 or 64 of the bar 56. Each mounting block 76 and 78 has a body 86 and a flange 88. The blocks 76 and 78 are oriented so that the flange portions 88 extend toward one another. Fasteners 90a and 90b extends through the cover plate 50, through a block 76 or 78 respectively, through the bar 56, through the mounting block 76 of the vertically adjacent lower pawl assembly 70a, and through the cover plate 52 to hold the mounting blocks 76 and 78 and the bar 56 in a fixed position. As such, the mounting blocks 76 and 78 and bar 56 are not moveable with respect to the cover plates 50 and 52 or each other.

Figure 4:
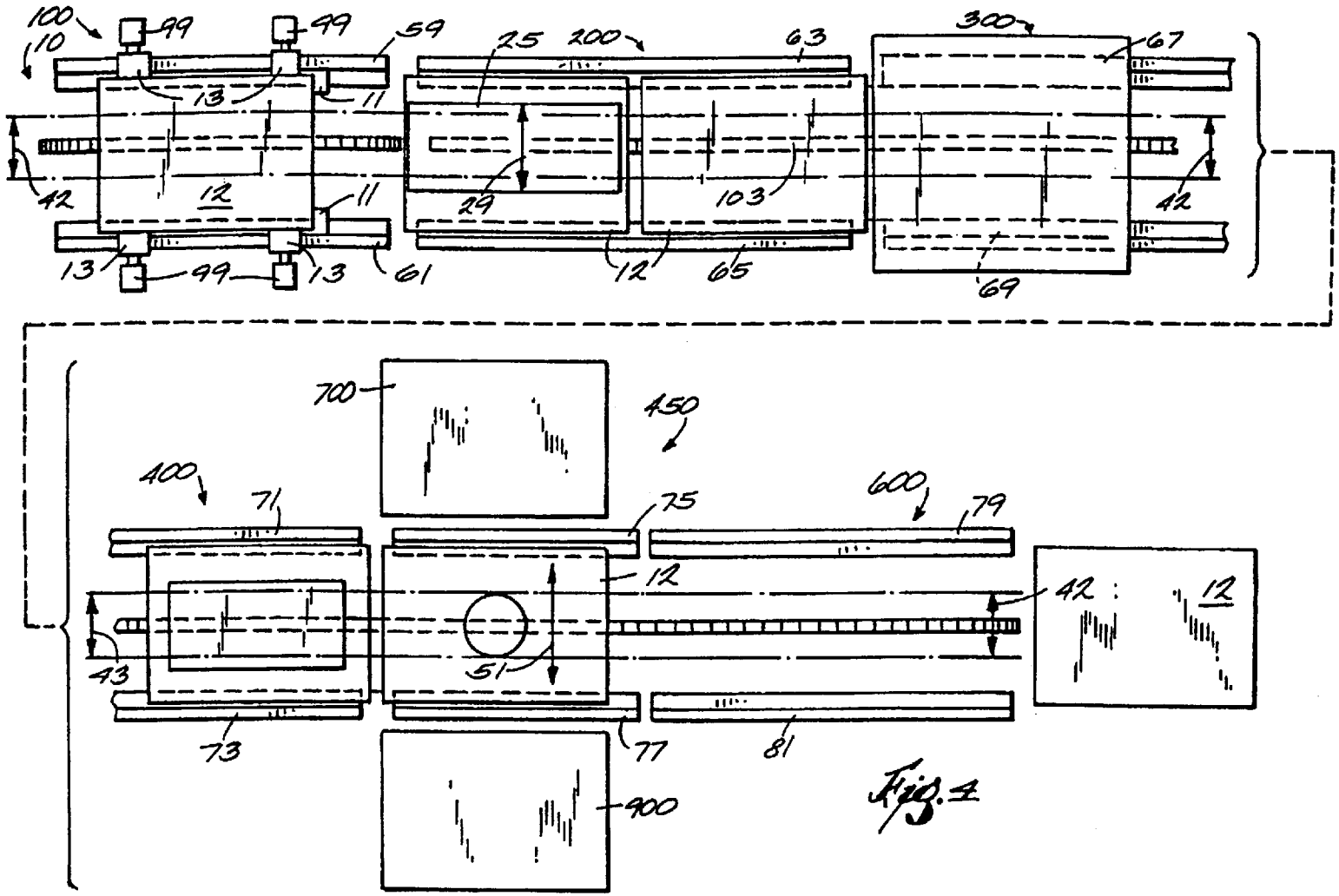
FIG. 4 is a schematic plan view of an infeed module of the inspection handler apparatus.

As best shown in FIGS. 4 and 5, the outer pawl 72 is generally U-shaped and includes a central passageway 92, a recess 94 axially aligned with the passageway 92, a pair of outwardly extending flanges 96 and 98, a pair of elongate axially aligned channels 100 and 102, an upwardly extending wall 104, and an outwardly extending mounting tab 106.

As best shown in FIGS. 18 and 19, the inner pawl 74 includes a shaft 108 having a first end 110, a second end 112 and a notch or window 114 therein. A pawl extension 116 is secured to the end 110 of the shaft 108. The extension 116 is generally rectangular, dimensioned so as to be moveable within the passageway 92, and preferably terminates in a chamfered or sloped edge 118. The inner pawl 74 is movably positioned within the outer pawl 72 such that the extension 116 is housed in the passageway 92 and the shaft 108 is partially housed in the recess 94 so that the end 112 of the shaft 108 is adjacent the wall 104 of the outer pawl 72.

The inner pawl 74 is moveable relative to the outer pawl 72 between a first position wherein the window 114 in the shaft 108 does not align with both of the channels 100 and 102 in the outer pawl 72 so as to allow the channels 100 and 102 to communicate and a second position wherein the window 114 in the shaft 108 is aligned with the channels 100 and 102 so as to allow communication between the channels 100 and 102 across the recess 94.

The inner spring 84 surrounds the shaft 108. The inner spring 84 normally biases the inner pawl 74 so that the extension 116 extends outwardly from the passageway 92 in a direction away from the tab 106 of the outer pawl 72. A tray guide bracket 120 is secured to the outer pawl 72 with fasteners to retain the inner pawl 74 within the passageway 92. A pair of plates 124 are secured to the outer pawl 72 over each channel 100 and 102.

Referring now to FIG. 18, the outer pawl 72 is positioned between the mounting blocks 76 and 78 so that the mounting tab 106 extends outwardly from the cover plates 50 and 52 in a direction away from the bay 54. In this orientation, the flanges 88 of the blocks 76 and 78 align with a respective flange 96 or 98 on the outer pawl 72 and one of the outer springs 80 or 82 is positioned between the flange 88 of that blocks 76 or 78 and the flange 96 or 98 of that outer pawls 72. In this position, the outer pawl 72 is moveable relative to the cover plates 50 and 52 along a path defined by the cover plate 50, the bar 56 and the mounting blocks 76 and 78. The outer springs 80 and 82 bias the outer pawl 72 such that the bracket 120 extends outwardly from and above the cover plate 50.

Figure 3:
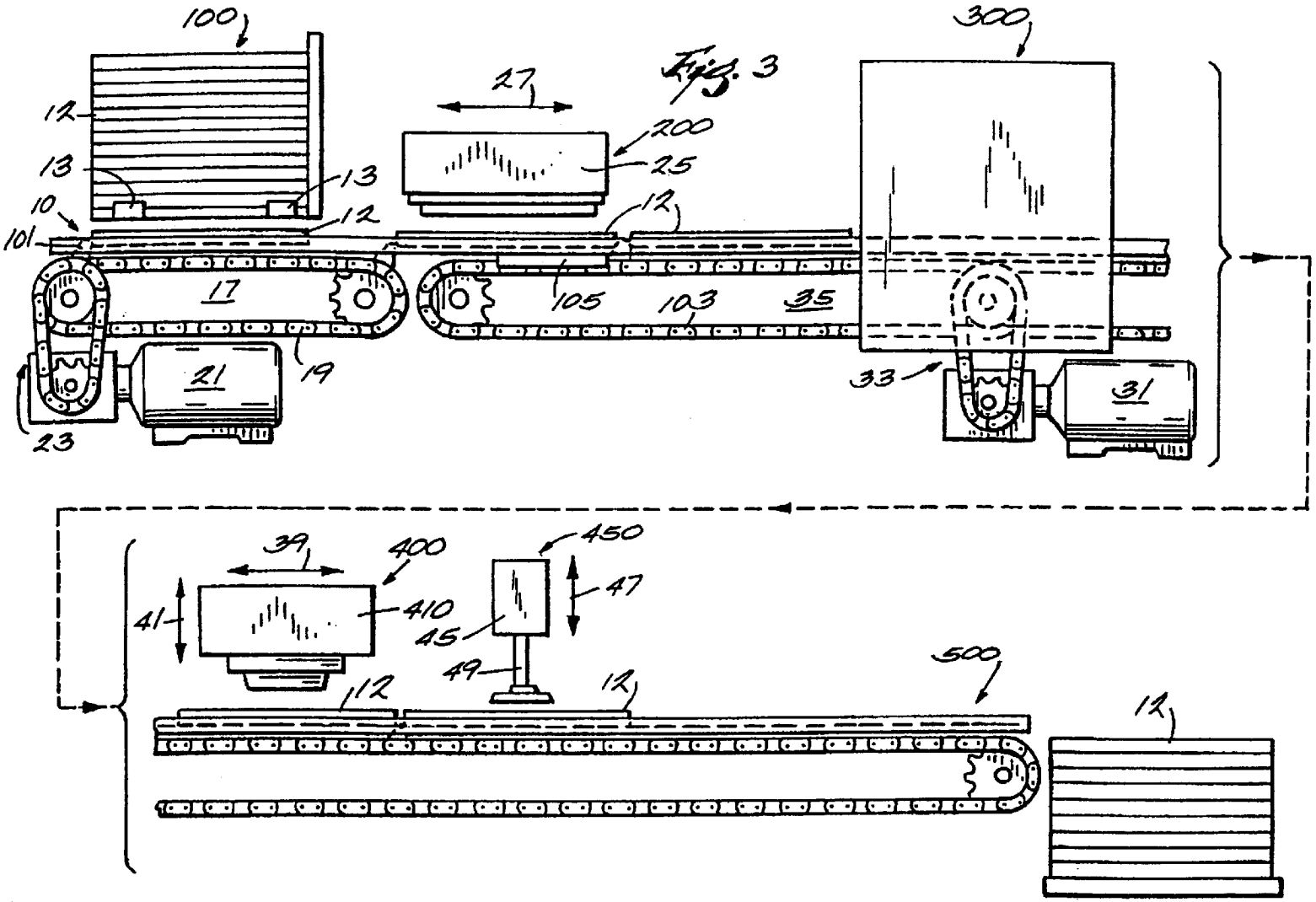
FIG. 3 is a schematic front view of the inspection handler apparatus.
Figure 22:
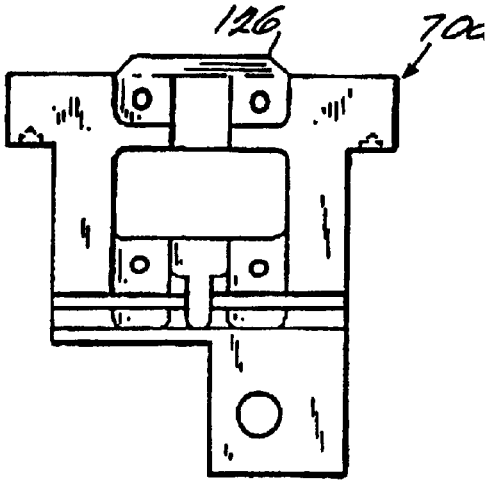
FIG. 22 is a plan view of a lower outer pawl.
Figure 23:
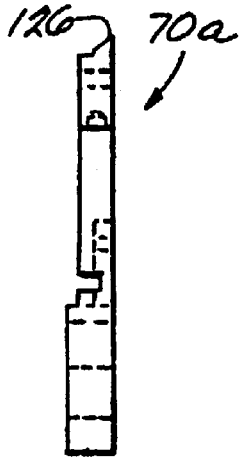
FIG. 23 is an end view of the lower outer pawl of FIG. 22.
Figure 20:
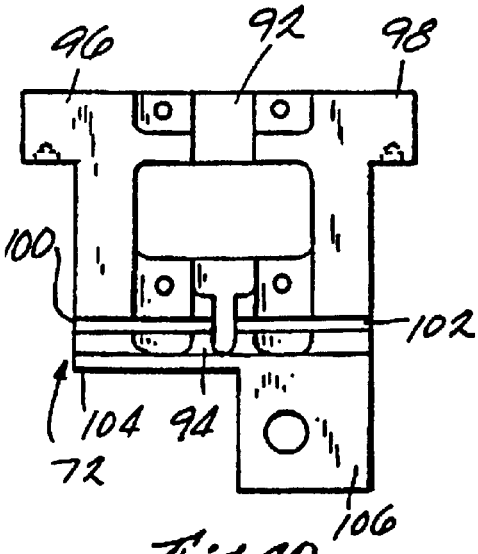
FIG. 20 is a plan view of an upper outer pawl.
Figure 21:
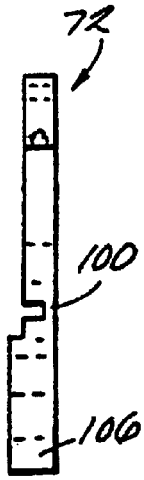
FIG. 21 is an end view of the upper outer pawl of FIG. 20.

As shown in FIGS. 19, 22 and 23, the four lower pawl assemblies 70a–d are substantially identical to the upper pawl assemblies 66a–d, however, with the following differences. The outer pawl 72 of the lower pawl assemblies 70a–d further includes a middle bracket 126 extending outwardly from the outer pawl 72. With respect to the inner pawl 74 of the lower pawl assemblies 70a–d, the inner pawl 74 includes a pawl extension 116 that terminates in a rectangular end portion 130 (FIG. 3).

Referring back to FIG. 17, the tabs 106 of the pair of upper pawl assemblies 66a and 66b on the side 46 of assembly 12 are connected with a cross bar 132 that is secured to each tab 106 with a fastener. The tabs 106 of the pair of lower pawl assemblies 70a and 70b on the side 46 of the assembly 12 are connected with a cross bar 134 that is secured to each tab 106 with a fastener.

Likewise on the side 48 of the assembly 12, the tabs 106 of the pair of upper pawl assemblies 66c and 66d are connected with a cross bar 136 that is secured to each tab 106 with a fastener and the tabs 106 of the pair of lower pawl assemblies 70c and 70d are connected with a cross bar 138 that is secured to each tab 106 with a fastener.

The cross bars 132, 134, 136 and 138 are adapted to be moved away from the bay 54 in the same manner as cross bars 389 and 390 are activated in the previously described embodiment to actuate movement of each outer pawl 72/inner pawl 74 unit relative to the cover plates 50 and 52 and in a direction away from the bay 54. Preferably, the cross bar 132 and the cross bar 134 are individually movable by a first mechanism such as an air cylinder and cam and the cross bar 136 and the cross bar 138 are individually moveable by a second mechanism such as an air cylinder and cam. It should be noted that other methods to actuate movement of the cross bars 132, 134, 136 and 138 can be utilized.

Continuing to refer to FIG. 17, the assembly 12 includes a plunger 144 between and extending outwardly from the cover plates 50 and 52 on the end 42 of the assembly 12. A dowel 146 extends outwardly from the cover plates 50 and 52 on the end 44 of the assembly 12. The dowel 146 and plunger 144 are axially aligned along a center pivot axis 148. A pair of edge guides 150 extends inwardly into the bay 54. The edge guides 150 are moveable and function to enable the assembly 12 to accommodate variations in lengths of trays 14 in the bay 54. A mounting plate 152a–d is mounted adjacent each of the four pairs of aligned upper and lower pawl assemblies 66a/70a, 66b/70b, 66c/70c, and 66d/70d, respectively.

The function of the tray inverter assembly 12 is to releasably hold one or two trays 14 at a time in the bay 54. To accomplish this, the upper and lower pawl assemblies 66 and 70 are selectively moved so that the extensions 116 of the inner pawls 74 can be retractably housed within the notches 40 of the trays 14. When the extensions 116 of the upper or lower pawl assemblies 66 and 70, respectively are within the notches 40 of a tray 14, the tray 14 can be raised, lowered or rotated with the assembly 12 without falling from the assembly 12.

The tray inverter assembly 12 can be utilized in conjunction with tray inverter mechanism 302. The assembly 12 is mounted in the tray inverter mechanism using the plunger 144 and dowel 146. To start the cycle, the assembly 12 has secured in the bay 54 a first tray 14. A second tray 14 is supported by a supporting surface such as guide rails and has devices in the pockets 18 of the top surface 16. When the devices in the second tray 14 need to be flipped over, the assembly 12 with the first tray 14 secured within the bay 54 is moved (such as downwardly) by the lift/lower mechanism until the first tray 14 contacts and nests with the second tray 14 (FIG. 10). The extensions 116 (preferably of the lower pawl assemblies 70a–d) that hold the first tray 14 within the assembly 12 are retracted from the four notches 40 of the first tray 14 by retracting the cross bars 134 and 138.

The assembly 12 is further moved downwardly (approximately the width of one tray) such that the extensions 116 of the upper pawl assemblies 66a–d are aligned with the four notches 40 of the first tray 14 and the extensions 116 of the lower pawl assemblies 70a–d are aligned with the four notches 40 of the second tray 14. The cross bars 132, 134, 136 and 138 are then released by the mechanisms such that the extensions 116 of the upper pawl assemblies 66a–d are housed within the notches 40 of the first tray 14 and the extensions 116 of the lower pawl assemblies 70a–d are housed within the notches 40 of the second tray 14. The extensions 116 along with the brackets 120 and 126 will maintain the orientation of the first tray 14 relative to the second tray 14.

The two nested trays 14 are then raised upwardly by the lift/lower mechanism. The rotation mechanism is then actuated to rotate the nested trays 14 through 180 degrees about the pivot axis 148. During the rotation, the devices are transferred from the pockets 18 on the top surface 16 of the second tray 14 to the pockets 22 on the bottom surface 20 of the first tray 14. In other words, the devices are flipped over such that the device surface that used to abut the second tray 14 is now visible and can be inspected. The rotated trays 14 are then lowered to the supporting surface by the lift/lower mechanism until the first tray 14 contacts the supporting surface. The cross bars 132 and 136 of the upper pawl assemblies 66a–d are retracted thus releasing the first tray 14 (which now contains the devices) from the assembly 12.

The assembly 12 with the second tray 14 held by the extensions 116 of the lower pawl assemblies 70a–d is raised upwardly by the lift/lower mechanism and then rotated through 180 degrees about the pivot axis 148 by the rotation mechanism. The combination of the extensions 116, the guide brackets 120 and the bracket 126 maintain the positioning of the second tray 14 within the bay 54 of the assembly 54 throughout the rotation. The second tray 14 must be rotated by itself to maintain the proper orientation of the assembly 12 for the next inversion cycle. The first tray 14 can then by transported to an inspection station. The process can then begin again in that the assembly 12 and second tray 12 can be lowered to contact a third tray 14 having devices therein that are to be inverted.

When the extensions 116 of the upper and lower pawl assemblies 66a–d and 70a–d, respectively are moved into the notches 40 of a tray 14, it is important that a sensor arrangement make sure that the extensions 116 are positioned properly within the notches 40 before the tray 14 is inverted. If the tray 14 is not properly oriented and secured in the correct orientation in the bay 54 of the assembly 12, the devices will not be transferred properly from a pocket of one tray 14 to a corresponding adjacent pocket of the nested tray 14 and may even dislodge entirely from the trays 14.

With specific reference to FIG. 17, the tray inverter queue assembly 12 utilizes a photo-optic sensor arrangement for this purpose. It should be noted, however, that a switch arrangement or other like arrangements could also be employed in place of the photo-optics. The photo optic sensor arrangement uses light circuits to determine the positioning of the extensions. Specifically, there are four light circuits 154a–d of which only the two light circuits 154a and 154b associated with the upper pawl assemblies 66a–d are visible in FIG. 17.

FIG. 17 illustrates two of the light circuits 154a and 154b. The first light circuit 154a is constructed as follows. A first segment 156 of an optic conductor, such as 1 mm monofilament cable, extends from an anchoring station 158 on the mounting plate 152a, through the channel 100 and terminates adjacent the recess 94 of the upper pawl assembly 66a. A second segment 160 extends in the channel 102 from a point adjacent the recess 94, along the bar 56, through the channel 100 and terminates adjacent the recess 94 of the upper pawl assembly 66b. A third segment 162 extends from a point adjacent the recess 94 of the upper pawl assembly 66b, through the channel 102 and terminates in an anchoring station 164 on the mounting plate 152b.

Light, preferably red modulated light, is sent into the first segment 156 by a light source 168 such as, for example, model FS-MO available from Keyence Inc. of New Jersey. A sensor 170, preferably fixed near the supporting surface, measures the amount of light that has traveled along the light circuit 154a from the first segment 156, across the recess 94 of the upper pawl assembly 66a, along the second segment 160, across the recess 94 of the upper pawl assembly 66b, and along the third segment 162 to the terminal end 172 of the third segment 162. If the inner pawls 74 of either upper pawl assembly 66a or 66b are in their first positions (wherein the window 114 in the shaft 108 does not align with the channels 100 and 102 in the outer pawl 72), the sensor 170 adjacent the terminal end 172 of the third segment 162 will not detect any light because the light cannot pass across recesses 94 when the inner pawls are in their first position (thereby blocking the path of travel of the light across the recess 94).

If both of the inner pawls 74 of the upper pawl assemblies 66a and 66b are in their second positions (wherein the windows 114 in the shaft 108 aligns with the channels 100 and 102 in the outer pawl 72), the sensor 170 will detect received light at the terminal end 172 of the third segment 162 because light can travel across the recesses 94 of both upper pawl assemblies 66a and 66b through the windows 114 in the shafts 108 of the inner pawls 72 to complete the light circuit 154a.

The second light circuit 154b is shown in FIG. 17 between the upper pawl assemblies 66c and 66d on the side 48 of the assembly 12. The third and fourth light circuits 154c and 154d respectively are also similar to the first light circuit 154a, however, they extend between the pairs of lower pawl assemblies 70a/70b and 70c/70d, respectively.

The detailed operation of the sensor arrangement of the tray inverter queue assembly 12 is as follows. When the assembly 12 is not supporting any trays 14, the outer pawls 72 of the upper and lower pawl assemblies 66a–d and 70a–d are in their normal biased position and the inner pawls 74 are in their first position. Accordingly, the sensors 170 of the four light circuits 154a–d cannot detect any light at the respective terminal ends 172 of the third segments 162 and the light circuits 154a–d are said to be blocked.

When any of the cross bars 132–138 are moved outwardly in a direction away from the bay 54, the outer pawls 72 attached to the particular cross bar 132–138 also move outwardly against the force of the springs 80 and 82. When the outer pawls 72 are so moved, the inner pawls 74 passively move along with the outer pawls 72 as one unit. Accordingly, the inner pawls 74 remain in their first position such that none of the sensors 170 detected any received light at the terminal end 172 of the third segment 162. When the cross bars 132–138 are released, the springs 80 and 82 return the outer pawls 72 to their normal biased position. Since the inner pawls 74 have not moved relative to their respective outer pawls 72, the sensors 170 will still not detect any transmitted light at the terminal end 172 of the third segment 162 and the light circuits 154 remains blocked.

If there is a tray 14 positioned in the bay 54, for example aligned with the upper pawl assemblies 66a–d, when the cross bars 132 and 136 are released, the four outer pawls/inner pawls units of the upper pawl assemblies 66a–d travel toward the tray 14 because of the bias of the outer springs 80 and 82. Before the outer pawls 72 terminate their travel and reach their normal biased position at a point that is not in contact with the tray 14, the extensions 116 of the inner pawls 74 travel into the notches 40 of the tray 14 and contact the tray 14. When the extensions 116 contact the tray 14, because of the lower spring rate of the inner spring 84 as compared to the outer springs 80 and 82, the inner pawls 74 move an incremental distance relative to the respective outer pawls 72, in a direction toward the respective cross bar 132 and 136. As the inner pawls 74 move this incremental distance, the inner pawls 74 move into their second position such that the windows 114 in the shafts 108 align with the respective channels 100 and 102 and allow communication between then channels 100 and 102 of the outer pawls 72. When the windows 114 align with the channels 100 and 102, light on one side of the recess 94 of the outer pawls 72 is able to cross the recess 94.

If both inner pawls 94 have contacted the tray 14 within the notches 40 and moved into their second position, the first and second light circuits 154a and 154b will be completed such that the sensors 170 will receive transmitted light at the terminal end 172 of the third segment 162.

If a tray 14 is to be held in position by the upper pawl assemblies 66a–d, only if the first and second light circuits 154a and 154b are completed (sensors 170 detecting light at the terminal ends 172 of the third segments 162) is it certain that the upper pawl assemblies 66a and 66b have a secure hold on the tray 14. Likewise, if a tray 14 is to be held in position by the lower pawl assemblies 70a–d, only if the third and fourth light circuits 154c and 154d are completed is it certain that the lower pawl assemblies 70a–d have a secure hold on the tray 14.

Accordingly, before the pair of nested trays 14 are inverted, all four light circuits 154a–d should be checked to make sure light is detected by all four respective sensors 170, thus ensuring that the assembly 12 has a secured hold on both trays 14 to avoid any misplacement or dislodging of devices during the inversion of the nested trays 14.

With reference to FIG. 1, the inspection handler apparatus 10 includes a suitably programmed computer system 850 to control the operation and function of the apparatus as described above. Preferably, an Intel 860x86 or Pentium computer system is utilized. The computer system 850 includes an operator interface 851 which is utilized to select program commands and features and to enter information into program files.

Trays are processed in the inspection handler apparatus 10 as follows. It should be noted that the following description will follow one tray from the infeed module 100 to the outfeed module 500. However, in operation, the inspection and handler apparatus 10 preferably processes a plurality of trays at one time, with the trays being processed simultaneously in each of the various modules.

Before processing, the various tray holding mechanisms are adjusted to accommodate the dimensions of the trays to be processed. The computer system 850 communicates the spacing between rows of devices on one tray and the spacing between sequential trays to the scanner and PVI modules and the PNP module 450.

The trays, having devices contained therein, that are to be processed are stacked in the infeed module 100. One tray is then indexed onto the linear path 42 into the scanner module 200. In the scanner module 200, the tray is transported in the scanner module along the linear path 42 where the devices on the tray are inspected by the laser scanner. The results of the laser inspection for each device on the tray are communicated to the computer system 850. While another tray on the other bed is being scanned, the tray is transported along the linear path 42 to the inverter module 300.

After the devices on the tray are inverted above the linear path 42, the resulting tray is transported along the linear path to the PVI module 400. The camera in the PVI module inspects the devices on the tray and reports the results of the inspection of each device to the computer system 850. As the devices on part of the tray are being inspected by the camera 401, the PNP module 450 will be moving devices, on the other end of the tray that have already been scanned by the camera, to their destinations. The computer system 850 communicates the results of the various inspections for each device on the tray to the PNP module 450 so that each device can be transported to its proper destination.

If the destination of the "good" devices, those that have passed all of the inspections, is carrier tape, the PNP module 450 transports the good devices from the tray, one at a time, to the taper module 900. Any "reject" devices, those that have not passed the inspections, are transported by the PNP module 450 to a tray in tray module 700.

If the good devices are to remain in the tray, the PNP module 450 removes the reject devices to the tray module 700. The resulting empty pockets of the tray are filled with good devices that are transported by the PNP module 450 from a tray in the tray module 700 to the empty pocket(s) of the tray. In this mode of operation, before processing starts, a tray of good devices is loaded into one of the bays of the tray module 700.

We claim:

1. Apparatus *for processing electronic circuit devices contained in a work piece* comprising, in combination, an infeed station, an outfeed station,

*a work piece containing electronic circuit devices,* first transport mechanism extending from said infeed station to said outfeed station for transporting [a] *said* work piece along a horizontal path from said infeed station to said outfeed station, a plurality of additional stations serially arranged along said path between said infeed and outfeed stations, a control unit operative to activate selective ones of said stations to perform predetermined operations on said [work piece] *electronic circuit devices* and sequence said work piece through said stations under the influence of said transport mechanism in response to the initiation and completion of said predetermined operations in said stations, one of said additional stations is a first inspection station [positioned], said first inspection *station* with reference to the movement of said work piece by said first transfer mechanism being located downstream of said infeed station, an inverter station positioned downstream of said first inspection station, a second inspection station positioned downstream of said inverter station, a sorting station positioned downstream of said second inspection station, said [work piece] *electronic circuit devices* having a top side to be inspected at said first inspection station and an underside to be inspected at said second inspection station, and said inverter station includes an inversion unit for displacing said work piece *and said electronic circuit devices contained therein* vertically [relative to] *and displaced from* said first transport mechanism and, when displaced vertically, turning said work piece *and said electronic circuit devices contained therein* to reverse the position of the top side and the underside of said [work piece] *electronic circuit devices*, said inversion unit returning said work piece to said first transport mechanism after it has been so turned.

2. The apparatus of claim 1 wherein said transport mechanism extends in a straight, linear direction so that said path is a straight, linear path.

3. The apparatus of claim 2 wherein said inversion mechanism displaces said work piece vertically above said path *while maintaining said work piece generally parallel to said path*.

4. The apparatus of claim 1 wherein said [carrier] *work piece* is a tray and said [work piece comprises] *electronic circuit devices comprise* a plurality of units arranged in a predetermined manner in said tray for inspection at said first and second inspection stations.

5. The apparatus of claim 4 wherein said transport mechanism extends in a straight, linear direction so that said path is a straight, linear path.

6. The apparatus of claim 5 wherein said inversion mechanism displaces said work piece vertically above said path.

7. The apparatus of claim 6 wherein said inversion unit includes a frame for capturing and releasing a tray to be displaced by said inversion mechanism.

8. The apparatus of claim 7 wherein said frame includes a pair of relatively spaced side members between which a tray is positioned when in said inversion unit and also includes a plurality of clamp sets arranged on both of said side members, and each clamp set includes a pair of vertically spaced clamp members and each clamp member is movable relative to said frame between a first position in engagement with a tray in said frame and a second position spaced from and out of engagement with a tray.

9. The apparatus of claim 8 wherein a first one of said clamp members of each set engages and holds a prepositioned tray in said frame as a carrier tray containing said units is being transported to said inversion station and the second of said clamp members of each clamp set engages said carrier tray when it is positioned in said inversion station, said prepositioned tray being empty of said units, said trays having a predetermined thickness and the clamp members in each clamp set being spaced relative to said tray thickness to hold said prepositioned tray in engagement with said carrier tray, said inversion mechanism rotates said frame and the trays held therein 180 degrees and transfers said units from said carrier tray to said prepositioned tray, when said prepositioned tray is returned to said first transport mechanism said first one of said clamp members of each of said clamp sets releases said prepositioned tray for travel to said second inspection station, and said second of said clamp members of each of said clamp sets maintains engagement of said carrier tray with said carrier tray replacing said prepositioned tray in said frame to function as said prepositioned tray as a subsequent carrier tray is transported to said inversion station.

10. The apparatus of claim 9 wherein said inversion mechanism includes a support fixture engaging said frame and including a second transport mechanism for raising and lowering said frame relative to said first transport mechanism and said path, said prepositioned tray being held by said support fixture above said path as said carrier tray is being transported to said inversion station, activating means at said inversion station responsive to the presence of said carrier tray in said inversion station to activate said second transport mechanism to lower said frame into engagement with said carrier tray and for engagement by said first one of said clamp members with said carrier tray and said activating means further operative in response to engagement of said clamp members with said tray to activate said second transport mechanism to raise said frame for rotation of said trays.

11. The combination of claim 10 wherein said first transport mechanism includes elongated guide members arranged on opposite side of and parallel to said path and engageable with said carrier tray, and drive members selectively engageable with said carrier tray when said carrier tray is engaged with said guide members to propel said tray along said guide members and said path.

12. The apparatus of claim 10 wherein said sorting station includes a pick and place station downstream of said inversion station, a tray station offset from said path, a taper station offset from said path, and selector means for selectively activating said pick and place assembly alternatively
to displace units to said tray station, and
to displace units to said taper station.

13. The apparatus of claim 1 including a pick and place device in said sorting station operative to remove selected ones of said [units] *electronic circuit devices* from said [carrier tray] *work piece* as it passes through said sorting station, and third transport means for [means for] moving said pick and place device with the selected [unit] *electronic circuit device* laterally of said path.

14. The apparatus of claim 13 *wherein said work piece is a tray and* including a tray station at said pick and place station but spaced laterally of said path, said tray station including a tray and a support for that tray, and said third transport device moving said pick and place device laterally to said tray at said tray station after said pick and place device has selected [a unit] *an electronic circuit device* from said tray in said pick and place station for deposit of said selected [unit] *electronic circuit device* in said tray at said tray station.

15. The apparatus of claim 9 wherein said clamp members of each set have a first position relative to said frame and in said first [positing] *position* being engageable with a tray in said frame, said clamp members have a second position displaced from said first position and in which they are not engageable with a tray in said frame, and a sensor at said clamp members sensing the position of said clamp members and operatively connected to said second transport mechanism to disable said second transport mechanism if said clamp members are not in their first position.

16. The apparatus of claim 15 wherein said sensor includes a light source, a light receiving mechanism, elongated light transmitting members extending from said light source to said clamp members and from said clamp members to said light receiving mechanism, said clamp members including a channel there aligning with said light transmitting members when said clamp members are in said first position and out of alignment with said light transmitting members when said clamp members are in said second position, said clamp members having light interrupting surfaces surrounding said channels and *said* light interrupting surfaces being aligned with said light transmitting members when said clamp members are in said second position, and said light receiving mechanism operatively connected to said second transport mechanism operative to disable said second transport mechanism when light is not transmitted thereto.

17. A method of inspection *for electronic circuit devices* comprising the steps of introducing a plurality of [units] *electronic circuit devices* to be inspected into an input station, transporting said [units] *electronic circuit devices* from said input station to a first inspection station along a generally horizontal path, inspecting said [units] *electronic circuit devices* at said first inspection station, transporting said [units] *electronic circuit devices* from said first inspection station to an inverter station, moving said [units] *electronic circuit devices* at said inverter station vertically from said horizontal path to an inversion location directly above said path and rotating said [units] *electronic circuit devices* while said [units] *electronic circuit devices* are in said inversion location, returning said inverted [units] *electronic circuit devices* to said horizontal path after said rotation, transporting said [units] *electronic circuit devices* from said inverter station to a second inspection station, transporting said [units] *electronic circuit devices* to a sorting station from said second inspection station, and sorting said [units] *electronic circuit devices* at said sorting station based on the inspection conducted at said first and second inspection stations.

18. The method of claim 17 wherein the transport of said [units] *electronic circuit devices* through said stations is along a straight, linear path.

19. The method of claim 18 including the steps of said [units] *electronic circuit devices* being loaded into a carrier tray, positioning a prepositioned tray in said inverter station prior to the transport of said carrier tray to said inverter station, bringing said trays into engagement in said inversion location and rotating said trays simultaneously in said inversion location thereby transferring said [units] *electronic circuit devices* from said carrier tray to said prepositioned tray, transporting said prepositioned tray to said path and leaving said carrier tray in said inverter station to then become a prepositioned tray to cooperate with a subsequent carrier tray transported to said inverter station, and said prepositioned tray to which said [units] *electronic circuit devices* were transferred at said inverter station being transported through said second inspection station to said sorting station.

20. The method of claim 19 wherein said [units] *electronic circuit devices* are displaced vertically above said path.

21. The method of claim 20 wherein the path of movement of said carrier tray is a straight, linear path.

22. The method of claim 17 including prepositioning a tray in said frame prior to [an] *a* carrier tray containing said [units] *electronic circuit devices* being transported to said inversion station, moving said prepositioned tray into engagement with said carrier tray when said carrier tray is in said inversion station, displacing said prepositioned tray and carrier tray simultaneously above said path and rotating said trays to reverse the position of said [tray] *trays* so that one assumes the position of the other, lowering said trays toward said path and positioning said prepositioned tray on said path, and releasing said prepositioned tray for movement along said path to said second inspection station and raising said carrier tray above said path to the position vacated by the prepositioned [trays] *tray*.

23. The method of claim 22 wherein said inversion mechanism rotates said trays and the [units] *electronic circuit devices* therein 180 degrees to [transfers] *transfer* said [units] *electronic circuit devices* from said carrier tray to said prepositioned tray.

24. The method of claim 22 wherein said carrier tray left in said inverter station is rotated after the transfer of said [units] *electronic circuit devices*.

25. The method of claim 19 wherein said sorting station includes a pick and place device removing selected ones of said [units] *electronic circuit devices* from said carrier tray as it passes through said sorting station, and said pick and place device selecting [units] *electronic circuit devices* and moving them laterally of said path.

26. The method of claim 25 including positioning a tray adjacent said sorting station but spaced laterally of said path, and moving said pick and place device laterally to said tray spaced laterally of said path after said pick and place device has selected [a unit] *an electronic circuit device* from said tray in said sorting station and depositing said selected [unit] *electronic circuit device* in said laterally spaced tray.

27. An apparatus for processing a work piece having first and second oppositely-facing surfaces, the apparatus comprising:

an infeed station;

an outfeed station;

a first tray adapted to bold the work piece;

a transport mechanism for transporting said first tray in a downstream direction from said infeed station to said outfeed station, said transport mechanism receiving said tray from said infeed station with the first surface of the work piece facing away from the transport mechanism;

a first inspection station positioned downstream of said infeed station, said first inspection station adapted to inspect the first surface of the work piece;

an inverter station positioned downstream of said first inspection station and including a second tray substantially identical to said first tray and positioned in an upside-down orientation above said transport mechanism, a plurality of clamp members movable to selectively engage and disengage said first and second trays and to lift said first tray into a sandwiched engagement with said second tray, and an inversion mechanism rotating said clamp members and trays 180 degrees to transfer the work piece from said first tray to said second tray, wherein said second tray containing the work piece is returned to said transport mechanism by said clamp members and said first tray is held in an upside-down orientation above said transport mechanism; and a second inspection station positioned downstream of said inverter station and upstream of said outfeed station, said second inspection station receiving the second tray on the transport mechanism to inspect the second surface of said work piece.

28. The apparatus of claim 27, wherein said transport mechanism includes first and second side edges extending the length of said transport mechanism within the inverter station, wherein first and second vertical planes include said first and second side edges, respectively, and wherein said first tray is lifted and said first and second trays are inverted between said first and second vertical planes.

29. The apparatus of claim 27, further comprising a sorting station positioned downstream of said second inspection station and upstream of said outfeed station.

30. The apparatus of claim 27, wherein said inversion station includes a frame supporting said clamping members, said first and second trays having a predetermined thickness and the clamp members being spaced relative to said tray thickness to avoid interference between said clamp members when holding said first and second trays in sandwiched engagement with each other.

31. The apparatus of claim 27, wherein said inversion mechanism includes a support fixture engaging said frame and an elevator for raising and lowering said frame relative to said transport mechanism, said second tray being held by said support fixture above said transport mechanism as said first tray is being transported to said inversion station, said apparatus further comprising activating means at said inversion station responsive to the presence of said first tray in said inversion station to activate said elevator to lower said frame into engagement with said first tray and for engagement by at least one of said clamp members with said first tray, said activating means further operative in response to engagement of said clamp members with said first tray to activate said elevator to raise said frame to sandwich said first and second trays together.

* * * * *